United States Patent
Pyeon et al.

(10) Patent No.: US 8,504,789 B2
(45) Date of Patent: Aug. 6, 2013

(54) BRIDGING DEVICE HAVING A FREQUENCY CONFIGURABLE CLOCK DOMAIN

(75) Inventors: Hong Beom Pyeon, Ottawa (CA); Hunsam Jung, Stittsville, CA (US); Peter B. Gillingham, Ottawa (CA)

(73) Assignee: MOSAID Technologies Incorporated, Ottawa, Ontario (CA)

( * ) Notice: Subject to any disclaimer, the term of this patent is extended or adjusted under 35 U.S.C. 154(b) by 390 days.

(21) Appl. No.: 12/823,472

(22) Filed: Jun. 25, 2010

(65) Prior Publication Data

US 2010/0327923 A1 Dec. 30, 2010

Related U.S. Application Data

(60) Provisional application No. 61/221,309, filed on Jun. 29, 2009.

(51) Int. Cl.
*G06F 12/00* (2006.01)

(52) U.S. Cl.
USPC ............ 711/167; 711/103; 711/114; 711/149

(58) Field of Classification Search
None
See application file for complete search history.

(56) References Cited

U.S. PATENT DOCUMENTS

| | | | |
|---|---|---|---|
| 6,564,286 B2* | 5/2003 | DaCosta | 711/103 |
| 7,515,471 B2 | 4/2009 | Oh | |
| 2004/0193743 A1 | 9/2004 | Byers et al. | |
| 2007/0076502 A1 | 4/2007 | Pyeon | |
| 2007/0153576 A1 | 7/2007 | Oh | |
| 2008/0201588 A1 | 8/2008 | Pyeon | |
| 2009/0039927 A1 | 2/2009 | Gillingham | |
| 2010/0005214 A1* | 1/2010 | Trombley et al. | 710/310 |
| 2010/0070696 A1* | 3/2010 | Blankenship | 711/105 |
| 2010/0091538 A1 | 4/2010 | Kim et al. | |

FOREIGN PATENT DOCUMENTS

JP   2004362215 A   12/2004

OTHER PUBLICATIONS

International Patent Application No. PCT/CA2010/000948, International Search Report dated Nov. 5, 2010, p. 2.

* cited by examiner

*Primary Examiner* — Shawn X Gu
(74) *Attorney, Agent, or Firm* — Shin Hung; Borden Ladner Gervais LLP

(57) ABSTRACT

A composite memory device including discrete memory devices and a bridge device for controlling the discrete memory devices. A configurable clock controller receives a system clock and generates a memory clock having a frequency that is a predetermined ratio of the system clock. The system clock frequency is dynamically variable between a maximum and a minimum value, and the ratio of the memory clock frequency relative to the system clock frequency is set by loading a frequency register with a Frequency Divide Ratio (FDR) code any time during operation of the composite memory device. In response to the FDR code, the configurable clock controller changes the memory clock frequency.

28 Claims, 19 Drawing Sheets

BRIDGING DEVICE HAVING A FREQUENCY CONFIGURABLE CLOCK DOMAIN

CROSS REFERENCE TO RELATED APPLICATIONS

This application claims the benefit of priority from U.S. Provisional Patent Application No. 61/221,309 filed Jun. 29, 2009, the disclosure of which is expressly incorporated herein by reference in its entirety.

BACKGROUND

Semiconductor memory devices are important components in presently available industrial and consumer electronics products. For example, computers, mobile phones, and other portable electronics all rely on some form of memory for storing data. Many memory devices are available as commodity, or discrete memory devices, but also the need for higher levels of integration and higher input/output (I/O) bandwidth has led to the development of embedded memory, which can be integrated with systems, such as microcontrollers and other processing circuits.

Most consumer electronics employ, non-volatile devices, such as flash memory devices, for storage of data. Demand for flash memory devices has continued to grow significantly because these devices are well suited in various applications that require large amounts of non-volatile storage, while occupying a small physical area. For example, flash is widely found in various consumer devices, such as digital cameras, cell phones, universal serial bus (USB) flash drives and portable music players, to store data used by these devices. Also, flash devices are used as solid state drives (SSDs) for hard disk drive (HDD) replacement. Such portable devices are preferably minimized in form factor size and weight. Unfortunately, multimedia and SSD applications require large amounts of memory which can increase the form factor size and weight of their products. Therefore, consumer product manufacturers compromise by limiting the amount of physical memory included in the product to keep its size and weight acceptable to consumers. Furthermore, while flash memory may have a higher density per unit area than DRAM or SRAM, its performance is typically limited due to its relatively low I/O bandwidth that negatively impacts its read and write throughput.

In order to meet the ever-increasing demand for and ubiquitous nature of applications of memory devices, it is desirable to have high-performance memory devices, i.e., devices having higher I/O bandwidth, higher read & write throughput, and increased flexibility of operations.

SUMMARY

The embodiments of the bridge device embodiments shown in the present application provides a high speed interface between a system and discrete memory devices.

According to a present aspect, there is provided bridge device for controlling discrete memory devices in response to global command. The bridge device includes a first clock domain having first logic circuits and first control circuits, a frequency controller, and a second clock domain having second logic circuit and second control circuits. The first logic circuits and the first control circuits operate in synchronization with a memory clock for issuing local commands to the discrete memory devices. The frequency controller generates the memory clock as one of at least two dynamically selectable clock divide ratios of a system clock provided to the bridge device. The second logic circuit and the second control circuits operate in synchronization with the system clock for converting the global command received synchronously with the system clock into the local command synchronized with the memory clock.

In an embodiment of the aspect, the bridge device further includes a memory for storing write data received by at least one system data input port to be provided to the discrete memory devices, and for storing read data received from the discrete memory devices to be provided to at least one system data output port. The memory can include a first memory input/output path controlled by the first control circuits of the first clock domain for providing the write data stored in a memory array of the memory to the discrete memory devices at a first data rate corresponding to a frequency of the memory clock. The memory can receive the read data at the first data rate for writing to the memory array. The memory can include a second memory input/output path controlled by the second control circuits of the second clock domain for providing the write data to the memory array at a second data rate corresponding to a frequency of the system clock. The memory can provide the read data from the memory array at the second data rate. In this embodiment, the second clock domain further includes data input path circuits for providing the write data received at the at least one system data input port to the second memory input/output path, and data output path circuits for providing the read data received from the second memory input/output path to the at least one system data output port. The data input path circuits and the data output path circuits operate in synchronization with the system clock.

According to an aspect of the present embodiment, the second logic circuits and the second control circuits include conversion circuits for converting commands of the global command into the local command compatible with the discrete memory devices synchronously with the system clock. The first logic circuits and the first control circuits are configured for providing the local command to the discrete memory devices synchronously with the memory clock. The first logic circuits and the first control circuits receive write data from the memory for output to the discrete memory devices synchronously with the memory clock when the local command corresponds to a write operation for a selected discrete memory device.

In an alternate embodiment of the present aspect, the second clock domain further includes an operational code register and a register. The operational code register receives and stores a frequency divide op-code for controlling the frequency controller to change a divide ratio of the system clock to a ratio corresponding to a received frequency divide ratio code. The register receives and stores the frequency divide ratio code. The frequency divide ratio code can include multiple bits corresponding to integer and non-integer divide ratios.

In another embodiment of the present aspect, the frequency controller includes clock dividers and selector. The clock dividers are each configured to divide the system clock by different integer and non-integer divide ratios to provide intermediate clock signals. The selector passes one of the intermediate clock signals as the memory clock in response to a frequency divide ratio code corresponding to any one of the different integer and non-integer divide ratios. The frequency controller includes a path control circuit for selectively passing the system clock to one of the clock dividers in response to the frequency divide ratio code.

In yet another embodiment, the frequency controller includes a clock divider and clock combining logic. The clock divider provides first intermediate clock signals on first edges of the system clock and second intermediate clock signals on second edges of the system clock, where each of the first intermediate clock signals and the second intermediate clock signals have a period set by a ratio selector signal corresponding to the one of at least two dynamically selectable clock divide ratios. The clock combining logic logically combines selected first intermediate clock signals and selected second intermediate clock signals to provide the memory clock having a frequency corresponding to the system clock divided by the one of at least two dynamically selectable clock divide ratios. In this embodiment, each of the first intermediate clock signals is generated one cycle of the system clock after a previous first intermediate clock signal is generated, and each of the second intermediate clock signals is generated one cycle of the system clock after a previous first intermediate clock signal is generated. The clock divider can be configured to generate each of the first intermediate clock signals in response to an initial first intermediate clock signal, and to generate each of the second intermediate clock signals in response to an initial second intermediate clock signal, where the initial second intermediate clock signal is generated a predetermined number of cycles of the system clock corresponding to the one of at least two dynamically selectable clock divide ratios after the initial first intermediate clock signal is generated. In a further embodiment, the frequency controller includes a frequency divide ratio decoder for generating ratio selector signals in response to a frequency divide ratio code representing the one of at least two dynamically selectable clock divide ratios.

According to another embodiment, the clock divider includes a first configurable logic loop circuit and a second configurable logic loop circuit. The first configurable logic loop circuit generates the first intermediate clock signals at the first edges of the system clock, and the first configurable logic loop circuit being initiated in response to a first set signal. The second configurable logic loop circuit generates the second intermediate clock signals at the second edges of the system clock, and the second configurable logic loop circuit being initiated in response to a second set signal received after a number of cycles of the system clock predetermined by the one of at least two dynamically selectable clock divide ratios. The first configurable logic loop circuit can include cascaded first edge triggered logic elements, and loop adjustment circuits. The cascaded first edge triggered logic elements each have an output for providing one of the first intermediate clock signals and an input for latching a previous one of the first intermediate clock signals in response to the first edges of the system clock, the cascaded first edge triggered logic elements including a first initializing logic element configured to receive the first set signal. The loop adjustment circuits change a size of the first configurable logic loop circuit by selectively coupling only one of the first intermediate clock signals to the first logic element in response to the ratio selector signals. The second configurable logic loop circuit can include cascaded second edge triggered logic elements and loop adjustment circuits. The cascaded second edge triggered logic elements each having an output for providing one of the second intermediate clock signals and an input for latching a previous one of the second intermediate clock signals in response to the second edges of the system clock, the cascaded second edge triggered logic elements including a second initializing logic element configured to receive the second set signal. The loop adjustment circuits change a size of the second configurable logic loop circuit by selectively coupling only one of the second intermediate clock signals to the second logic element in response to the ratio selector signals.

In yet a further embodiment, the clock combining logic includes logic configuration circuitry and clock generation circuitry. The logic configuration circuitry provides control signals in response to the ratio selector signals. The clock generation circuitry is configurable by the control signals for enabling a predetermined combination of the selected first intermediate clock signals and the selected second intermediate clock signals to be used for generating the memory clock having a frequency corresponding to the system clock divided by the one of at least two dynamically selectable clock divide ratios.

In another embodiment, the frequency controller includes a clock initialization circuit for providing the first set signal and the second set signal in response to a reset condition. The clock initialization circuit includes at least one signal detector, a reset circuit, and a startup synchronizer. The at least one signal detector for provides at least one detection signal in response to a transition of at least one received signal. The reset circuit resets the first configurable logic loop circuit and the second configurable logic loop circuit in response to the at least one detection signal. The startup synchronizer provides the first set signal and the second set signal in response to the at least one detection signal, the second set signal being provided after a number of cycles of the system clock predetermined by the one of at least two dynamically selectable clock divide ratios. The at least one signal detector can include a chip enable signal detector and a divide ratio detector. The chip enable signal detector provides a first detection signal when a transition of a chip enable signal is detected. The divide ratio detector provides a second detection signal when a change in a frequency divide ratio code corresponding to the one of at least two dynamically selectable clock divide ratios is detected, the at least one detection signal including the first detection signal and the second detection signal.

The reset circuit can include a power up reset circuit for providing a third detection signal when a power supply voltage reaches a predetermined threshold level. The reset circuit generates a first reset signal for resetting the first configurable logic loop circuit and a second reset signal for resetting the first configurable logic loop circuit in response to at least one of the first detection signal, the second detection signal and the third detection signal. In particular, the reset circuit generates the first reset signal at one of the first edges of the system clock after receiving at least one of the first detection signal, the second detection signal and the third detection signal, and generates the second reset signal at one of the second edges of the system clock immediately following the one of the first edges. The startup synchronizer can include an initializing logic element, cascaded logic elements and phase adjustment circuit. The initializing logic element generates the first set signal in response to the at least one detection signal at one of the second edges of the system clock. The cascaded logic elements generate set configuration signals in response to the first set signal at subsequent second edges of the system clock following the one of the second edges. The phase adjustment circuit generates the second set signal in response to the ratio selector signal at one of the first edges of the system clock.

BRIEF DESCRIPTION OF THE DRAWINGS

Reference will now be made, by way of example, to the accompanying drawings.

DETAILED DESCRIPTION

Figure 1A:
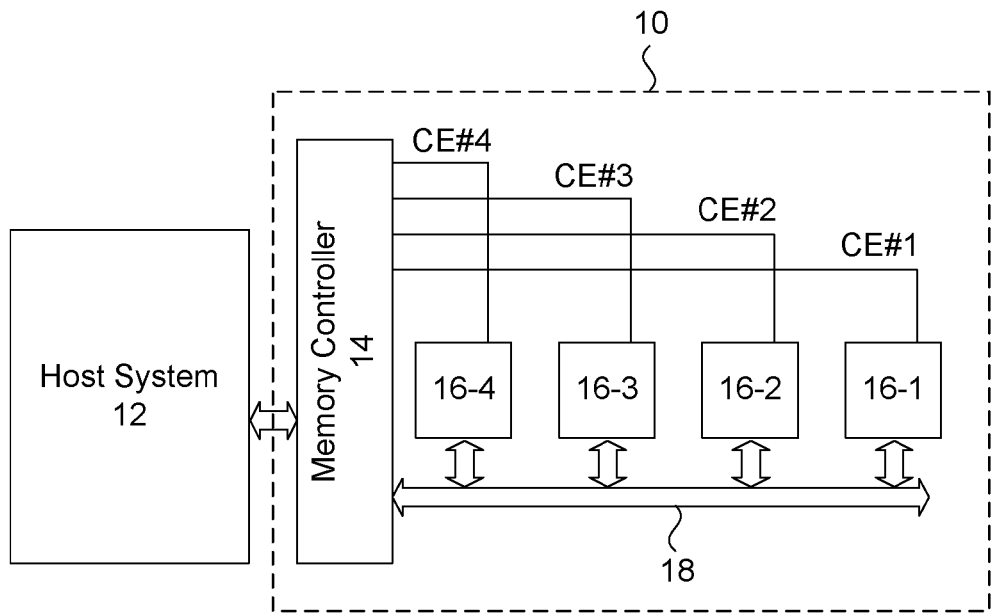
FIG. 1A is a block diagram of an example non-volatile memory system.

Generally, at least some embodiments are directed to a composite memory device including discrete memory devices and a bridge device for controlling the discrete memory devices in response to global memory control signals having a format or protocol that is incompatible with the memory devices. The discrete memory devices can be commercial off-the-shelf memory devices or custom memory devices, which respond to native, or local memory control signals. The global and local memory control signals correspond to commands and command signals each having different formats.

To improve overall read and write performance of the composite memory device relative to the discrete memory devices, the bridge device is configured to receive write data and to provide read data at a frequency greater than the maximum rated frequency of the discrete memory devices. However, the discrete memory devices within the composite memory device operate cannot provide its read data fast enough to the bridge device in real time so that the bridge device can output the read data at its higher data rate. Therefore to compensate for this mismatch in speed, the bridge device includes memory to temporarily store at least a portion of a page of data read from the page buffer of a discrete memory device, or to be written to the page buffer of a discrete memory device.

Therefore, the bridge device of the present embodiment has at least two different clock domains. A first clock domain includes circuits responsible for providing commands to the discrete memory devices, for providing write data from the memory to the discrete memory devices, and circuits for controlling read data received from the discrete memory devices to be stored in the memory. Accordingly, the operation of the circuits in the first clock domain are synchronized with a memory clock having a first frequency, which corresponds to the operating frequency of the discrete memory devices. A second clock domain includes all the remaining circuits responsible for receiving and storing external write data destined for the discrete memory devices into the memory, and for providing the read data from the discrete memory devices stored in the memory. Generally, the circuits of the second clock domain are synchronized to operate at a frequency at least equal to or greater than the frequency of the discrete memory devices. The clock signal provided for the second clock domain can be a system clock provided by a discrete clock generator or a controller, such as a memory controller.

The composite memory device, and in particular the bridge device, receives only the system clock. Therefore the memory clock having the first frequency is generated internally by clock control circuitry in the bridge device. While a phase locked loop (PLL) circuit or a delay locked loop (DLL) circuit can be included in such clock control circuitry to generate the memory clock signal having the first frequency, DLL's and PLL's are known to be power inefficient circuits. Therefore they are not suitable for use in portable electronics or devices where a finite power supply, such as a battery, is the only available power source. Furthermore, discrete memory devices of the same batch may have different maximum operating frequencies. However, designing and manufacturing a different bridge device for different discrete memory device operating frequencies is impractical and costly. Another dimension of complexity is introduced by fabrication variations within the bridge device itself. In particular, the circuits of the second clock domain are designed for a specific maximum operating frequency. However, due to fabrication variations between batches of circuits from a foundry, or between different foundries, some of the bridge devices may not operate properly at the desired maximum operating frequency. Furthermore, environmental conditions can affect the performance of the transistors, such as for example elevated ambient temperature.

Therefore, the first and second clock frequencies of the two respective clock domains are sometimes designed for the "worst case" scenario. However, this may result in a bridge device with limited performance characteristics that cannot take advantage of discrete memory devices capable of operating at frequencies greater than the first frequency of the memory clock. Similarly, circuits of the bridge device designed specifically for a conservative system clock frequency or a limited temperature range cannot take full advantage of a robust fabrication process that allows for a more aggressive design. Thus, the potential for better performance is sacrificed.

In accordance with the present embodiments, a configurable clock controller is provided, which receives a system clock and generates the memory clock having a frequency that is a predetermined ratio of the system clock. The system clock frequency is dynamically variable between a maximum and a minimum value, and the divide ratio of the memory clock frequency relative to the system clock frequency is set by loading a frequency register with a Frequency Divide Ratio (FDR) code any time during operation of the composite memory device. In response to the FDR code, the configurable clock controller changes the memory clock frequency. This level of flexibility enables users to maximize the performance of both the composite memory device and of the discrete memory devices. In particular, this flexibility allows any system clock frequency up to a maximum system frequency to be selected, and then programming the memory clock frequency as close to the maximum memory frequency as possible to minimize the time required for data transfer between the discrete memory devices and the bridge chip.

The system and device in accordance with the techniques described herein are applicable to a memory system having a plurality of devices connected in series. The devices are, for example, memory devices, such as dynamic random access memories (DRAMs), static random access memories (SRAMs), flash memories, DiNOR Flash EEPROM memories, Serial Flash EEPROM memories, Ferro RAM memories, Magneto RAM memories, Phase Change RAM memories, and any other suitable type of memory.

In the detailed description of example embodiments that follows, a number of illustrated circuits and circuit components are of a type which performs known operations on electronic signals. Those skilled in the art will have knowledge of alternative circuits or circuit components which are recognized as equivalent because they provide the same operations on the signals. Similar or the same reference numerals and labeling may have been used in different figures to denote similar components or signals.

Following are descriptions of two different memory devices and systems to facilitate a better understanding of the later described composite memory device and bridge device embodiments.

FIG. 1A is a block diagram of a non-volatile memory system 10 integrated with a host system 12. The system 10 includes a memory controller 14 in communication with host system 12, and a plurality of non-volatile memory devices 16-1, 16-2, 16-3 and 16-4. For example the non-volatile memory devices 16-1-16-4 can be discrete asynchronous flash memory devices. The host system 12 includes a processing device such as a microcontroller, microprocessor, or a computer system. The system 10 of FIG. 1A is organized to include one channel 18, with the memory devices 16-1-16-4 being connected in parallel to channel 18. Those skilled in the art should understand that the system 10 can have more or fewer than four memory devices connected to it. In the presently shown example, the memory devices 16-1-16-4 are asynchronous and connected in parallel with each other.

Channel 18 includes a set of common buses, which include data and control lines that are connected to all of its corresponding memory devices. Each memory device is enabled or disabled with respective chip select (enable) signals CE1#, CE2#, CE3# and CE4#, provided by memory controller 14. In this and following examples, the "#" indicates that the signal is an active low logic level signal. In this scheme, one of the chip select signals is typically selected at one time to enable a corresponding one of the non-volatile memory devices 16-1-16-4. The memory controller 14 is responsible for issuing commands and data, via the channel 18, to a selected memory device in response to the operation of the host system 12. Read data output from the memory devices is transferred via the channel 18 back to the memory controller 14 and host system 12. The system 10 is generally said to include a multi-drop bus, in which the memory devices 16-1-16-4 are connected in parallel with respect to channel 18.

Figure 1B:
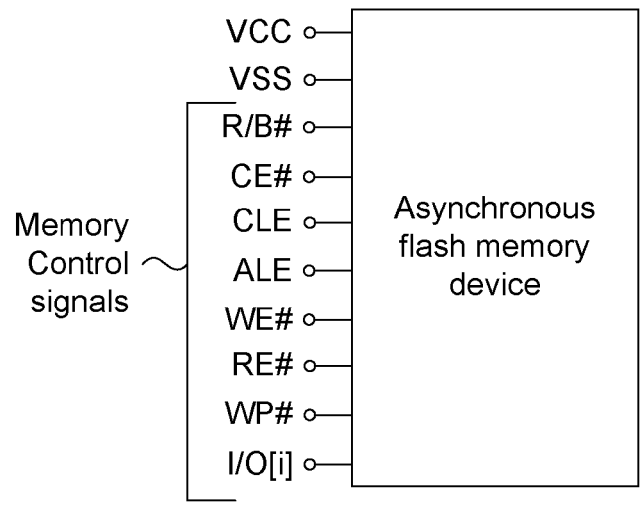
FIG. 1B is a diagram of a discrete flash memory device used in the example memory system of FIG. 1A.

FIG. 1B is a diagram of one of the discrete flash memory devices 16-1-16-4 which can be used in the memory system of FIG. 1A. This flash memory device includes several input and output ports, which include for example power supply, control ports and data ports. The term "ports" refers to a generic input or output terminals into the memory device, which includes package pins, package solder bumps, chip bond pads, and wireless transmitters and receivers for example. The power supply ports include VCC and VSS for supplying power to all the circuits of the flash memory device. Additional power supply ports can be provided for supplying only the input and output buffers, as is well known in the art. Table 1 below provides an example listing of the control and data ports, their corresponding descriptions, definitions, and example logic states. It should be noted that different memory devices may have differently named control and data ports which may be functionally equivalent to those shown in Table 1, but follow protocols specific to that type of memory device. Such protocols may be governed by an established standard, or customized for a particular application by the manufacturer. It is noted that that package pins and ball grid arrays are physical examples of a port, which are used for interconnecting signals or voltages of a packaged device to a board. The ports can include other types of connections, such as for example, terminals and contacts for embedded and system-in-package (SIP) systems.

TABLE 1

| Port | Description |
| --- | --- |
| R/B# | Ready/Busy: the R/B# is open drain port and the output signal is used to indicate the operating condition of the device. The R/B# signal is in Busy state (R/B# = LOW) during the Program, Erase and Read operations and will return to Ready state (R/B# = HIGH) after completion of the operation. |
| CE# | Chip Enable: the device goes into a low-power Standby mode when CE# goes HIGH during the device is in Ready state. The CE# signal is ignored when device is in Busy state (R/B# = LOW), such as during a Program or Erase or Read operation, and will not enter Standby mode even if the CE# input goes HIGH |

TABLE 1-continued

| Port | Description |
| --- | --- |
| CLE | Command Latch Enable: the CLE input signal is used to control loading of the operation mode command into the internal command register. The command is latched into the command register from the I/O port on the rising edge of the WE# signal while CLE is HIGH. |
| ALE | Address Latch Enable (ALE): the ALE signal is used to control loading address information into the internal address register. Address information is latched into the address register from the I/O port on the rising edge of the WE# signal while ALE is HIGH. |
| WE# | Write Enable: the WE# signal is used to control the acquisition of data from the I/O port. |
| RE# | Read Enable: the RE signal controls serial data output. Data is available after the falling edge of RE#. |
| WP# | Write Protect: the WP# signal is used to protect the device from accidental programming or erasing. The internal voltage regulator (high voltage generator) is reset when WP# is LOW. This signal is usually used for protecting the data during the power-on/off sequence when input signals are invalid. |
| I/O[i] | I/O Port: are used as a port for transferring address, command and input/output data to and from the device. Variable n can be any non-zero integer value. |

All the signals noted in Table 1 are generally referred to as the memory control signals for operation of the example flash memory device illustrated in FIG. 1B. It is noted that the last port I/O[i] is considered a memory control signal as it can receive commands which instruct the flash memory device to execute specific operations. Because a command asserted on port I/O[i] is a combination of logic states applied to each individual line making up I/O[i], the logic state of each signal of I/O[i] functions in the same manner as one of the other memory control signals, such as WP# for example. The main difference being that it is a specific combination of I/O[i] logic states controls the flash memory device to perform a function. The commands are received via its I/O ports and the command signals include the remaining control ports. Those skilled in the art understand that operational codes (op-codes) are provided in the command for executing specific memory operations. With the exception of the chip enable CE#, all the other ports are coupled to respective global lines that make up channel 18. Individual chip enable signals are provided to each flash memory device by the memory controller 14. All the ports are controlled in a predetermined manner for executing memory operations. This includes signal timing and sequencing of specific control signals while address, command and I/O data is provided on the I/O ports. Therefore, the memory control signals for controlling the asynchronous flash memory device of FIG. 1B has a specific format, or protocol.

Each of the non-volatile memory devices of FIG. 1A has one specific data interface for receiving and providing data. In the example of FIG. 1A, this is a parallel data interface commonly used in asynchronous flash memory devices, as well as in some synchronous flash memory devices. Standard parallel data interfaces providing multiple bits of data in parallel are known to suffer from well known communication degrading effects such as cross-talk, signal skew and signal attenuation, for example, which degrades signal quality, when operated beyond their rated operating frequency.

In order to increase data throughput, a memory device having a serial data interface has been disclosed in commonly owned U.S. Patent Publication No. 20070153576 entitled "Memory with Output Control", and commonly owned U.S. Patent Publication No. 20070076502 entitled "Daisy Chain Cascading Devices" which receives and provides data serially at a frequency, for example, 200 MHz. This is referred to as a serial data interface format. As shown in these commonly owned patent publications, the described memory device can be used in a system of memory devices that are serially connected to each other.

Figure 2A:
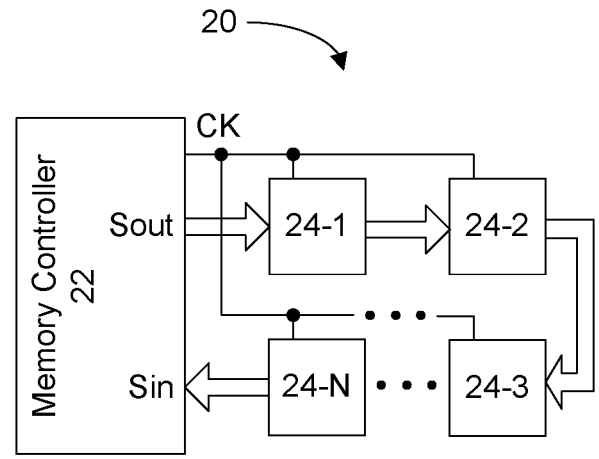
FIG. 2A is a block diagram of an example serial memory system.

FIG. 2A is a block diagram illustrating the conceptual nature of a serial memory system. In FIG. 2A, the serial ring-topology memory system 20 includes a memory controller 22 having a set of output ports Sout and a set of input ports Sin, and memory devices 24-1, 24-2, 24-3 and 24-N that are connected in series. The memory devices can be serial interface flash memory devices for example. While not shown in FIG. 2A, each memory device has a set of input ports Sin and a set of output ports Sout. These sets of input and output ports includes one or more individual input/output ports, such as physical pins or connections, interfacing the memory device to the system it is a part of. In one example, the memory devices can be flash memory devices. Alternately, the memory devices can be DRAM, SRAM, DiNOR Flash EEPROM, Serial Flash EEPROM, Ferro RAM, Magneto RAM, Phase Change RAM, or any other suitable type of memory device that has an input/output interface compatible with a specific command structure, for executing commands or for passing commands and data through to the next memory device. The current example of FIG. 2A includes four memory devices, but alternate configurations can include a single memory device, or any suitable number of memory devices. Accordingly, if memory device 24-1 is the first device of the system 20 as it is connected to Sout, then memory device 24-N is the Nth or last device as it is connected to Sin, where N is an integer number greater than zero. Memory devices 24-2, 24-3 and any memory devices between 24-3 and 24-N are then intervening serially connected memory devices between the first and last memory devices. In the example of FIG. 2A, the memory devices 24-1 to 24-N are synchronous and connected in series with each other and the memory controller 22.

Figure 2B:
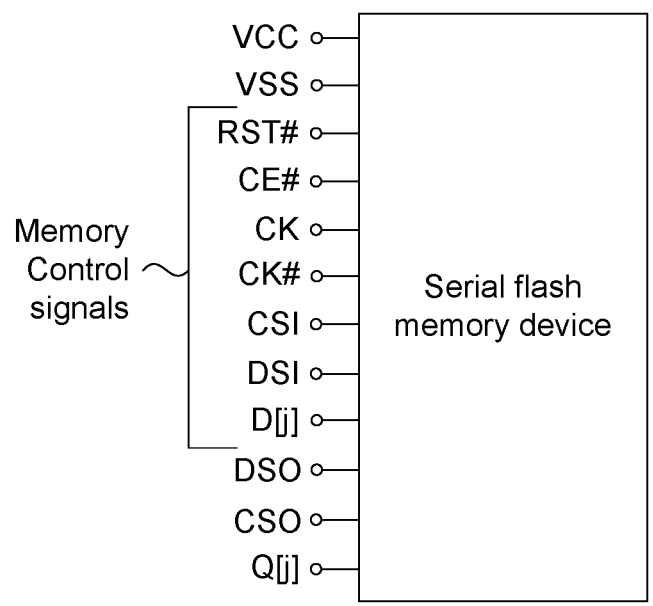
FIG. 2B is a diagram of a discrete serial interface flash memory device used in the example memory system of FIG. 2A.

FIG. 2B is a diagram of the serial interface flash memory device (24-1 to 24-N for example) which can be used in the memory system of FIG. 2A. This example serial interface flash memory device includes power supply ports, control ports and data ports. The power supply ports include VCC and VSS for supplying power to all the circuits of the flash memory device. Additional power supply ports can be provided for supplying only the input and output buffers, as is well known in the art. Table 2 below provides an example listing of the control and data ports, their corresponding descriptions, definitions, and example logic states. It should be noted that different memory devices may have differently named control and data ports which may be functionally equivalent to those shown in Table 1, but follow protocols specific to that type of memory device. Such protocols may be governed by an established standard, or customized for a particular application by the manufacturer.

of sets of signals used for controlling the discrete memory devices is referred to as a protocol or format. Therefore the asynchronous and serial flash memory devices operate in response to different memory control signal formats. This means that the serial interface flash memory device of FIG. 2B cannot be used in a multi-drop memory system, and cor-

TABLE 2

| Port | Description |
| --- | --- |
| CK/ CK# | Clock: CK is the system clock input. CK and CK# are differential clock inputs. All commands, addresses, input data and output data are referenced to the crossing edges of CK and CK# in both directions. |
| CE# | Chip Enable: When CE# is LOW, the device is enabled. Once the device starts a Program or Erase operation, the Chip Enable port can be de-asserted. In addition, CE# LOW activates and CE# HIGH deactivates the internal clock signals. |
| RST# | Chip Reset: RST# provides a reset for the device. When RST# is HIGH, the device is on the normal operating mode. When RST# is LOW, the device will enter the Reset mode. |
| D[j] | System Data Input ports: (j = 1, 2, 3, 4, 5, 6, 7 or 8) receives command, address and input data. If the device is configured in '1-bit Link mode (=default)', D1 is the only valid signal and receives one byte of packet in 8 crossings of CK/CK#. If the device is configured in '2-bit Link mode', D1 & D2 are only valid signals and receive one byte of packet in 4 crossings of CK/CK#. Unused input ports are grounded. |
| Q[j] | System Data Output ports: (j = 1, 2, 3, 4, 5, 6, 7 or 8) transmits output data during read operation. If device is configured in '1-bit Link mode (=default)', Q1 is the only valid signal and transmits one byte of packet in 8 crossings of CK/CK#. If the device is configured in '2-bit Link mode', Q1 & Q2 are the only valid signals and transmit one byte of packet in 4 crossings of CK/CK#. Unused output ports are DNC (= Do Not Connect). |
| CSI | Command Strobe Input: When CSI is HIGH, command, address and input data through D[j] are latched on the crossing of CK and CK#. When CSI is LOW, the device ignores input signals from D[j]. |
| CSO | Command Strobe Output: The echo signal CSO is a re-transmitted version of the source signal CSI. |
| DSI | Data Strobe Input: Enables the Q[j] buffer when HIGH. When DSI is LOW, the Q[j] buffer holds the previous data accessed. |
| DSO | Data Strobe Output: The echo signal DSO is a re-transmitted version of the source signal DSI. |

With the exception of signals CSO, DSO and Q[j], all the signals noted in Table 2 are the memory control signals for operation of the example flash memory device illustrated in FIG. 2B. CSO and DSO are retransmitted versions of CSI and DSI, and Q[j] is an output for providing commands and data. The commands are received via its D[j] system data ports and the command signals include the control ports RST#, CE#, CK, CK#, CSI and DSI. In the example configuration shown in FIG. 2A, all signals are passed serially from the memory controller 22 to each memory device in series, with the exception of CK, CK#, CE# and RST#, which are provided to all the memory devices in parallel. The serial interface flash memory device of FIG. 2B thus receives memory control signals having its own format or protocol, for executing memory operations therein.

Further details of the serially connected memory system of FIG. 2 are disclosed in commonly owned U.S. Patent Publication No. 20090039927 entitled "Clock Mode Determination in a Memory System" filed on Feb. 15, 2008, which describes a serial memory system in which each memory device receives a parallel clock signal, and a serial memory system in which each memory device receives a source synchronous clock signal.

As shown in FIG. 1B and FIG. 2B, the functional port assignments or definitions of the asynchronous and serial interface flash memory devices are substantially different from each other, and are accordingly, incompatible with each other. The functional port definitions and sequence, or timing, respondingly, the asynchronous flash memory device of FIG. 1B cannot be used in a serial connected ring topology memory system.

Although serial interface flash memory devices as shown in FIG. 2A and FIG. 2B are desirable for their improved performance over the asynchronous flash memory devices of FIGS. 1A and 1B, memory system manufacturers may not wish to introduce another flash product into their high volume flash fabrication facility. Due to their ubiquitous use in the industry, asynchronous flash memory devices are inexpensive because of the economies of scale of high volume manufacturing. Presently, memory system manufacturers do not have a solution for taking advantage of the performance benefits of serially interconnected devices while enjoying the economies of scale of high volume manufacturing.

At least some example embodiments provide a high performance composite memory device with a high-speed interface chip or a bridge device in conjunction with discrete memory devices, in a multi-chip package (MCP) or system in package (SIP). The bridge device provides an I/O interface with the system it is integrated within, and receives global memory control signals following a global format, and converts the commands into local memory control signals following a native or local format compatible with the discrete memory devices. The bridge device thereby allows the use of high volume commodity memory devices, such as asynchronous NAND flash devices, while providing the performance benefits afforded by the I/O interface of the bridge device. The bridge device can be embodied as a discrete logic die integrated with the discrete memory device dies in the package.

In the present examples, the global format is a serial data format compatible with the serial flash memory device of FIGS. 2A and 2B, and the local format is a parallel data format compatible with the asynchronous flash memory device of FIGS. 1A and 2B. However, the embodiments of the present invention are not limited to the above example formats, as any pair of memory control signal formats can be used, depending the type of discrete memory devices used in the composite memory device and the type of memory system the composite memory device is used within. For example, the global format of the memory system can follow the Open NAND Flash Interface (ONFi) standard, and the local format can follow the asynchronous flash memory device memory control signal format. For example, on specific ONFi standard is the ONFi 2.0 Specification. Alternatively, the global format can follow the serial data format compatible with the serial flash memory device of FIGS. 2A and 2B and the local format can follow the ONFi 2.0 Specification format.

Figure 3A:
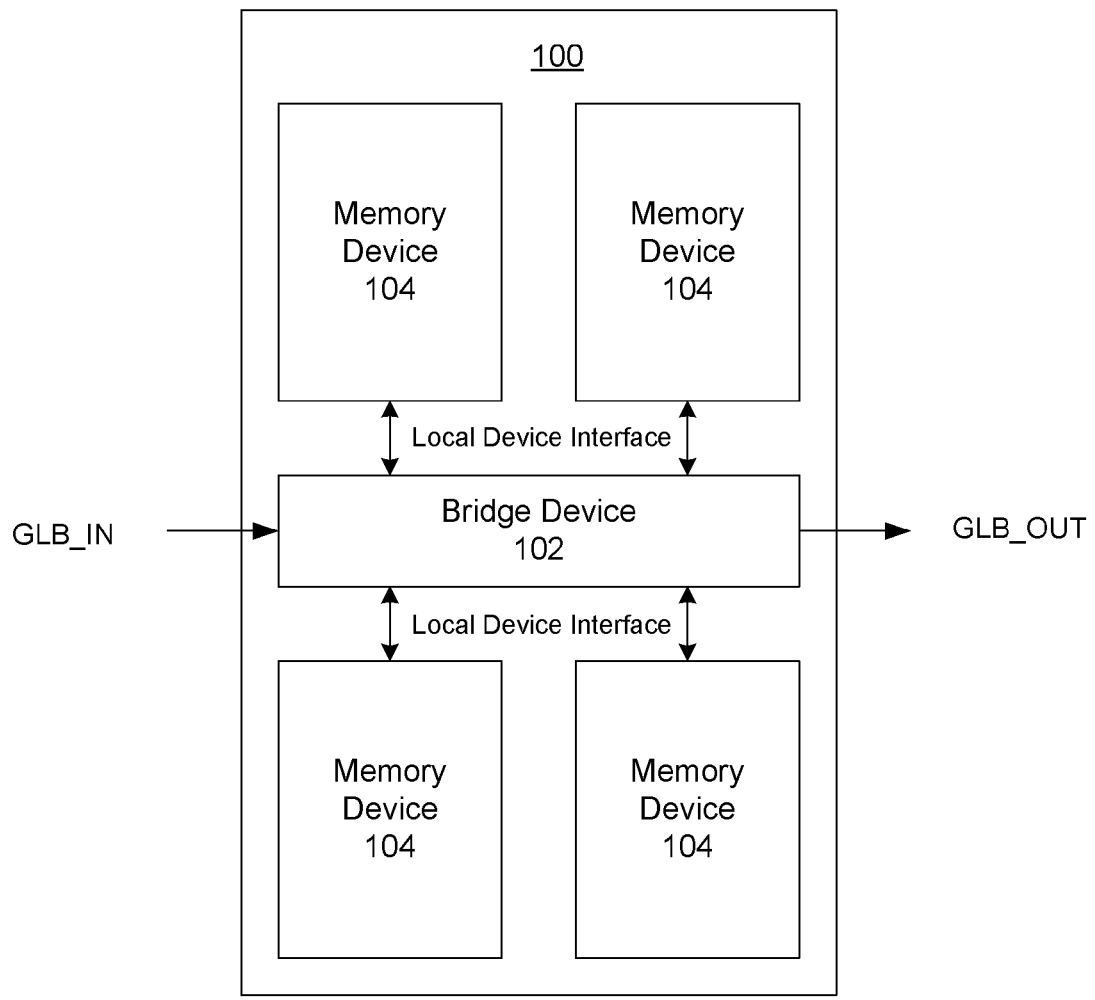
FIG. 3A is a block diagram of a composite memory device having four discrete memory devices and a bridge device in accordance with an embodiment.

FIG. 3A is a block diagram of a composite memory device, according to a present embodiment. As shown in FIG. 3A, composite memory device 100 includes a bridge device 102 connected to four discrete memory devices 104. Each of the discrete memory devices 104 can be asynchronous flash memory devices having a memory capacity of 8 Gb, for example, but any capacity discrete flash memory device can be used instead of 8 Gb devices. Furthermore, composite memory device 100 is not limited to having four discrete memory devices. Any suitable number of discrete memory devices can be included, when bridge device 102 is designed to accommodate the maximum number of discrete memory devices in the composite memory device 100.

Figure 3B:
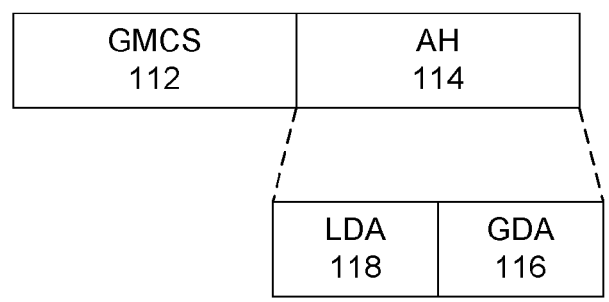
FIG. 3B is an illustration of a global command, according to a present embodiment.

Composite memory device 100 has an input port GLB_IN for receiving a global command, and an output port GLB_OUT for passing the received global command and read data. FIG. 3B is a schematic illustrating the hierarchy of a global command, according to a present embodiment. The global command 110 includes global memory control signals (GMCS) 112 having a specific format, and an address header (AH) 114. These global memory control signals 112 provide a memory command and command signals, such as the memory control signals for the serial interface flash memory device of FIG. 2B. The address header 114 includes addressing information used at the system level and the composite memory device level. This additional addressing information includes a global device address (GDA) 116 for selecting a composite memory device to execute an op-code in the memory command, and a local device address (LDA) 118 for selecting a particular discrete device within the selected composite memory device to execute the op-code. In summary, the global command includes all the memory control signals corresponding to one format, and further addressing information which may be required for selecting or controlling the composite memory device or the discrete memory devices therein.

It is noted that bridge device 102 does not execute the op-code or access any memory location with the address information. The bridge device 102 uses the global device address 116 to determine if it is selected to convert the received global memory control signals 112. If selected, bridge device 102 then uses the local device address 118 to determine which of the discrete memory devices the converted global memory control signals 112 is sent to. In order to communicate with all four discrete memory devices 104, bridge device 102 includes four sets of local I/O ports (not shown), each connected to a corresponding discrete memory device, as will be discussed later. Each set of local I/O ports includes all the signals that the discrete memory device requires for proper operation, and thereby functions as a local device interface.

Read data is provided by any one flash memory device 104 from composite memory device 100, or from a previous composite memory device. In particular, the bridge device 102 can be connected to a memory controller of a memory system, or to another bridge device of another composite memory device in a system of serially interconnected devices. The input port GLB_IN and output port GLB_OUT can be package pins, other physical conductors, or any other circuits for transmitting/receiving the global command signals, read data to the composite memory device 100 and write data from the composite memory device 100, and in particular, to and from bridge device 102. The bridge device 102 therefore has corresponding connections to the input port GLB_IN and the output port GLB_OUT to enable communication with an external controller, such as memory controller 22 of FIG. 2A, or with the bridge devices from other composite memory devices in the system. As will be shown in the example embodiment of FIG. 5, many composite memory devices can be connected serially to each other.

Figure 4:
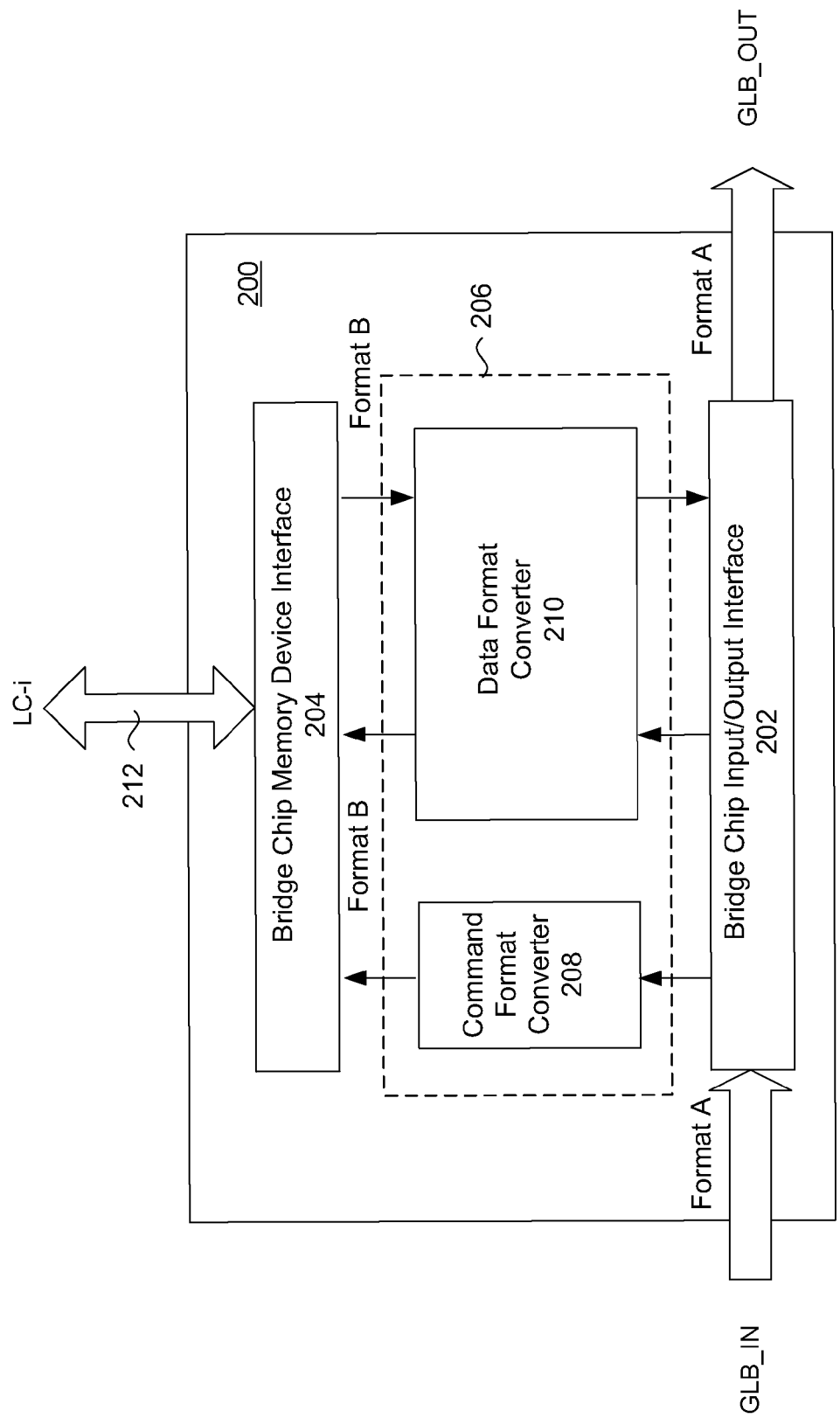
FIG. 4 is a block diagram of a bridge device in accordance with an embodiment.

FIG. 4 is a block diagram of a bridge device 200 in accordance with an embodiment, which corresponds to the bridge device 102 shown in FIG. 3A. The bridge device 200 has a bridge device input/output interface 202, a memory device interface 204, and a format converter 206. The format converter 206 includes a command format converter 208 for converting global memory control signals, which include global commands and global command signals in a first format to a second format, and a data format converter 210 for converting data between the first format and the second format. The command format converter 208 further includes a state machine (not shown) for controlling the discrete memory devices, such as discrete memory devices 104 of FIG. 3A in accordance with the second format in response to the global memory control signals in the first format.

The bridge device input/output interface 202 communicates with external devices, such as for example, with a memory controller or another composite memory device. The bridge device input/output interface 202 receives global commands from a memory controller or another composite memory device in the global format, such as for example in a serial command format. With further reference to FIG. 3B, logic in the input/output interface 202 processes the global device address 116 of the global command 110 to determine if the global command 110 is addressed to the corresponding composite memory device, and processes the local device address 118 in the global command 110 to determine which of the discrete memory devices of the corresponding composite memory device is to receive the converted command, which includes an op-code and optional row and column addresses and optional write data. If the global command is addressed to a discrete memory device connected to bridge device 200, the command format converter 208 in the format converter 206 converts the global memory control signals 112, which provides the op-code and command signals and any row and address information from the global format to the local format, and forwards it to the memory device interface 204. In the present embodiment, the bridge device operates internally with a parallel data format. If write data is provided to bridge device input/output interface 202 in a serial data format for example, then bridge device input/output interface 202 includes serial-to-parallel conversion circuitry for providing bits of data in parallel format. For read operations, bridge device input/output interface 202 includes parallel-to-serial conversion circuitry for providing bits of data in serial format for output through the GLB_OUT output port.

It is assumed that the global format and the local format are known, hence logic in command format converter 208 is specifically designed to execute the logical conversion of the signals to be compatible with the discrete memory devices 104. It is noted that command format converter 208 can include control logic at least substantially similar to that of a memory controller of a memory system, which is used for controlling the discrete memory devices with memory control signals having a native format. For example, command format converter 208 may include the same control logic of memory controller 14 of FIG. 1A if the discrete memory devices are asynchronous memory devices, such as memory devices 16-1 to 16-4. This means that the control logic in command format converter 208 provides the timing and sequencing of the memory control signals in the local format native to the discrete memory devices.

If the global command corresponds to a data write operation, the data format converter 210 in the format converter 206 converts the data from the global format to the local format, and forwards it to the memory device interface 204. The bits of read or write data do not require logical conversion, hence data format converter 210 ensures proper mapping of the bit positions of the data between the first data format and the second data format. Format converter 206 functions as a data buffer for storing read data from the discrete memory devices or write data received from the bridge device input/output interface 202. Therefore, data width mismatches between the global format and the local format can be accommodated. Furthermore, different data transmission rates between the discrete memory devices and the bridge device 200, and the bridge device 200 and other composite memory devices are accommodated due to the buffering functionality of data format converter 210.

The memory device interface 204 then forwards or communicates the converted command in the local command format to the discrete memory device selected by the local device address 118 in the global command 110 of FIG. 3B. In the present embodiment, the converted command is provided via a command path 212. In an embodiment, command path 212 includes i sets of dedicated local I/O ports LC-i, or channels, connected between each discrete memory device in the composite memory device and the memory device interface 204. The variable i is an integer number corresponding to the number of discrete memory devices in the composite memory device. For example, each LC-i channel includes all the ports shown in FIG. 1B and Table 1.

Following is a description of example operations of bridge device 200, with further reference to the composite memory device 100 of FIG. 3A. For a read operation, a global command, such as a global read command arriving at the bridge device input/output interface 202 through input port GLB_IN. This global read command includes the global memory control signals that provide an op-code and row and column information in the global format, for data to be read out from a discrete memory device 104 connected to the bridge device 200. In the present embodiments, the global command is received synchronously with the system clock, such as clock CK previously shown in Table 2. Once the bridge device input/output interface 202 determines that it has been selected for the global read command by comparing the global device address 116 to a predetermined address of the composite memory device 100, the command format converter 208 converts the global read command into the local format compatible with the discrete memory device 104 on which the read data command is to be executed. As will be described later, the composite memory device can have an assigned address. The local device address 118 of the global read command is forwarded to the memory device interface 204, and the converted read data command is provided to the discrete memory device addressed by the local device address via a corresponding set of local I/O ports of the command path 212. In the present embodiments, the local command is provided synchronously with a memory clock, which can have a frequency less than the system clock. It is noted that some discrete memory devices, such as NAND flash memory devices, are asynchronous and do not receive a clock signal. However, the memory control signals provided to such asynchronous memory devices have rising and falling edges generated synchronously to a clock, which in the present embodiments is the memory clock.

Data referred to as read data, is read from the selected discrete memory device 104 and provided to the data format converter 210 via the same local I/O ports of memory device interface 204 in the local format and at the memory clock frequency. The data format converter 210 then converts the read data from the local format to the global format and provides the read data from the selected discrete memory device 104 to the memory controller through output port GLB_OUT of bridge device interface 202 at the system clock frequency. Bridge device interface 202 includes internal switching circuitry for coupling either the read data from data format converter 210 or the input port GLB_IN to the output port GLB_OUT.

Figure 5:
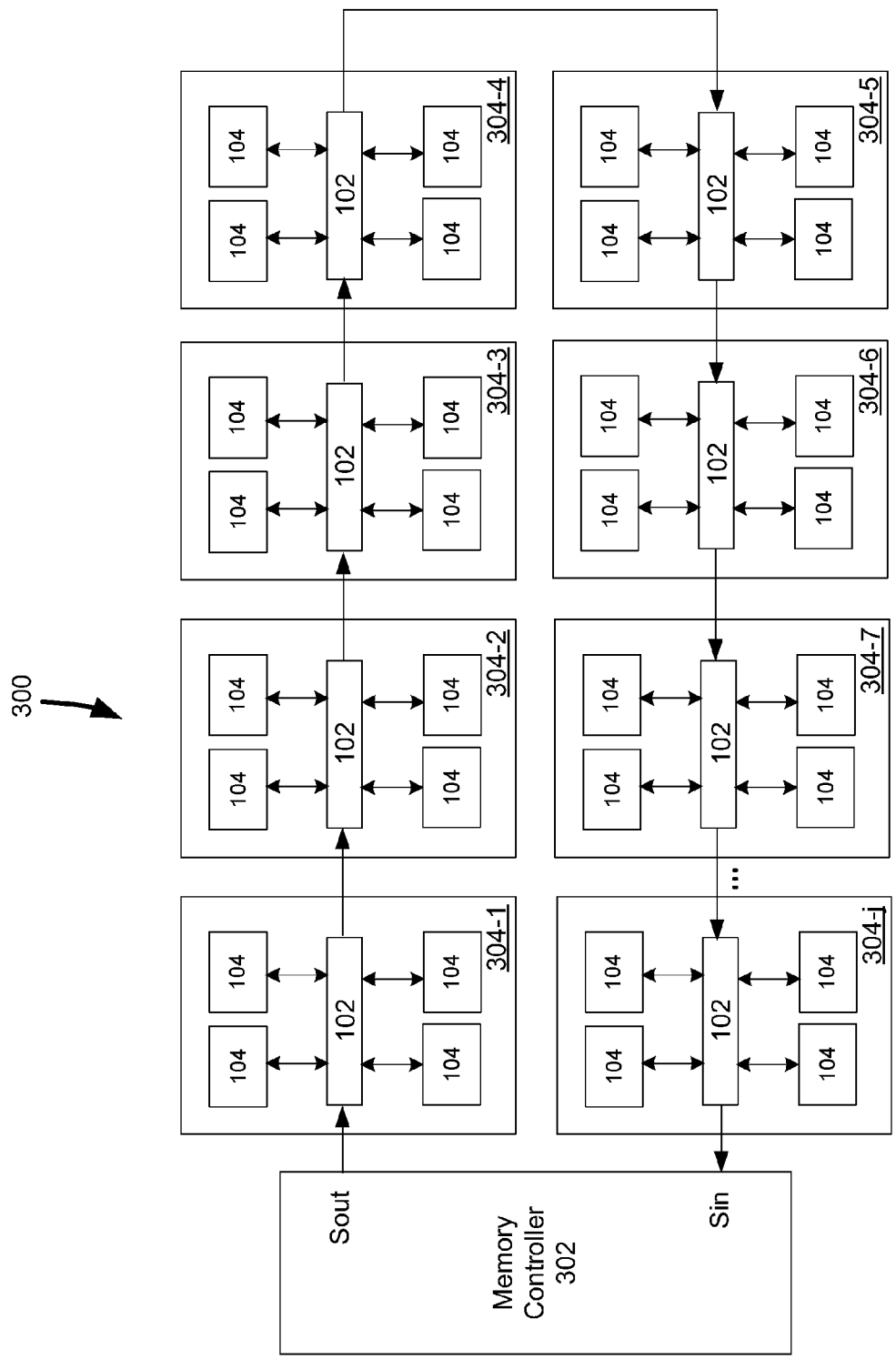
FIG. 5 is a block diagram of a memory system having a number of composite memory devices connected to a controller in a serial interconnected memory system in accordance with an embodiment.

FIG. 5 is a memory system having a plurality of composite memory devices connected in series in a ring topology with a memory controller, according to a present embodiment. In the present example, each of the shown composite memory devices has the architecture shown in FIG. 3A, which can have the bridge device 200 of FIG. 4. Memory system 300 of FIG. 5 is similar to the serial memory system 20 of FIG. 2A. Memory system 300 includes a memory controller 302 and composite memory devices 304-1 to 304-j, where j is an integer number. The individual composite memory devices 304-1-304-j are serially interconnected with the memory controller 302. Similar to system 20 of FIG. 2A, composite memory device 304-1 is the first composite memory device of memory system 300 as it is connected to an ouput port Sout of memory controller 302, and memory device 304-j is the last device as it is connected to an input port Sin of memory controller 302. Composite memory devices 304-2 to 304-7 are then intervening serially connected memory devices connected between the first and last composite memory devices. The Sout port provides a global command in a global format. The Sin port receives read data in the global format, and the global command as it propagates through all the composite memory devices.

Each of the composite memory devices shown in FIG. 5 is similar to the composite memory device 100 shown in FIG. 3A. Each of the composite memory devices has a bridge device 102 and four discrete memory devices 104. As was previously described, each bridge device 102 in each of the composite memory device is connected to respective discrete memory devices 104, and to either the memory controller 302 and/or a previous or subsequent composite memory device in the serial-ring topology or serial interconnection configuration. The function of each composite memory device 304-1 to 304-j is the same as previously described for the embodiments of FIG. 3A and FIG. 4.

In memory system 300, each composite memory device is assigned a unique global device address. This unique global device address can be stored in a device address register of the bridge device 102, and more specifically in a register of the input/output interface 202 of the bridge device block diagram shown in FIG. 4. This address can be assigned automatically during a power up phase of memory system 300 using a device address assignment scheme, as described in commonly owned U.S. Patent Publication No. 20080192649 entitled "Apparatus and Method for Producing Identifiers Regardless of Mixed Device Type in a Serial Interconnection". Furthermore, each composite memory device 304 can include a discrete device register for storing information about the number of discrete memory devices in each composite memory device 304. Thus during the same power up phase of operation, the memory controller can query each discrete device register and record the number of discrete memory devices within each composite memory device. Hence the memory controller can selectively address individual discrete memory devices 104 in each composite memory device 304 of memory system 300.

A description of the operation of memory system 300 follows, using an example where composite memory device 304-3 is to be selected for executing a memory operation. In the present example, memory system 300 is a serially connected memory system similar to the system shown in FIG. 2, and each of the discrete memory devices 104 are assumed to be asynchronous NAND flash memory devices. Therefore the bridge devices 102 in each of the composite memory devices 304-1 to 304-j are designed for receiving global commands in a global format issued by memory controller 302, and converting them into a local format compatible with the NAND flash memory devices. It is further assumed that memory system has powered up and addresses for each composite memory device have been assigned.

The memory controller 302 issues a global command from its Sout port, which includes a global device address 116 corresponding to composite memory device 304-3. The first composite memory device 304-1 receives the global command, and its bridge device 102 compares its assigned global device address to that in the global command. Because the global device addresses mismatch, bridge device 102 for composite memory device ignores the global command and passes the global command to the input port of composite memory device 304-2. The same action occurs in composite memory device 304-2 since its assigned global device address mismatches the one in the global command. Accordingly, the global command is passed to composite memory device 304-3.

The bridge device 102 of composite memory device 304-3 determines a match between its assigned global device address and the one in the global command. Therefore, bridge device 102 of composite memory device 304-3 proceeds to convert the local memory control signals into the local format compatible with the NAND flash memory devices. The bridge device then sends the converted command to the NAND flash memory device selected by the local device address 118, which is included in the global command. The selected NAND flash device then executes the operation corresponding to the local memory control signals it has received.

While bridge device 102 of composite memory device 304-3 is converting the global command, it passes the global command to the next composite memory device. The remaining composite memory devices ignore the global command, which is eventually received at the Sin port of memory controller 302. If the global command corresponds to a read operation, the selected NAND flash memory device of composite memory device 304-3 provides read data to its corresponding bridge device 102 in the local format. Bridge device 102 then converts the read data into the global format, and passes it through its output port to the next composite memory device. The bridge devices 102 of all the remaining composite memory devices pass the read data to the Sin port of memory controller 302. Those skilled in the art should understand that other global commands may be issued for executing the read operation, all of which are converted by the bridge device 102 of selected composite memory device 102.

In the embodiment of FIG. 5, a system clock can be provided to memory controller 302 and each of the composite memory devices in parallel by a discrete clock generator. Alternately, the memory controller can provide the system clock to all the composite memory devices in parallel. In a further alternate embodiment, all the composite memory devices receive and provide the system clock serially, in a source synchronous format. In any of these embodiments, each bridge device 102 receives the system clock for generating a local memory clock. The memory clock for each composite memory device can be referred to as a "local" memory clock since different composite memory devices in memory system 300 can be configured to operate with different memory clock frequencies.

In the present embodiment, the global command is propagated to all the composite memory devices in memory system 300. According to an alternate embodiment, the bridge devices 102 include additional logic for inhibiting the global command from propagating to further composite memory devices in the memory system 300. More specifically, once the selected composite memory device determines that the global device is addressed to it, its corresponding bridge device 102 drives its output ports to a null value, such as a fixed voltage level of VSS or VDD for example. Therefore, the remaining unselected composite memory devices conserve switching power since they would not execute the global command. Details of such a power saving scheme for a serially connected memory system are described in commonly owned U.S. Patent Publication No. 20080201588 entitled "Apparatus and Method for Producing Identifiers Regardless of Mixed Device Type in a Serial Interconnection", the contents of which are incorporated by reference in their entirety.

The previously described embodiment of FIG. 5 illustrates a memory system where each composite memory device 304-1 to 304-n having the same type of discrete memory devices therein, such as for example asynchronous NAND flash memory devices. This is referred to as a homogeneous memory system because all the composite memory devices are the same. In alternate embodiments, a heterogeneous memory system is possible, where different composite memory devices have different types of discrete memory devices. For example, some composite memory devices include asynchronous NAND flash memory devices while others can include NOR flash memory devices. In such an alternate embodiment, all the composite memory devices follow the same global format, but internally, each composite memory device has its bridge device 200 designed to convert the global format memory control signals to the local format memory control signals corresponding to the NOR flash memory devices or NAND flash memory devices.

In yet other embodiments, a single composite memory device could have different types of discrete memory devices. For example, a single composite memory device could include two asynchronous NAND flash memory devices and two NOR flash memory devices. This "mixed" or "heterogeneous" composite memory device can follow the same global format described earlier, but internally, its bridge device can be designed to convert the global format memory control signals to the local format memory control signals corresponding to the NAND flash memory devices and the NOR flash memory devices.

Such a bridge device can include one dedicated format converter for each of the NAND flash memory device and the NOR flash memory device, which can be selected by previously described address information provided in the global command. As described with respect to FIG. 3B, the address header 114 includes addressing information used at the system level and the composite memory device level. This additional addressing information includes a global device address (GDA) 116 for selecting a composite memory device to execute an op-code in the memory command, and a local device address (LDA) 118 for selecting a particular discrete device within the selected composite memory device to execute the op-code. The bridge device can have a selector that uses LDA 118 to determine which of the two format converters the global command should be routed to.

The previously described embodiments of the composite memory device show how discrete memory devices responsive to memory control signals of one format can be controlled using global memory control signals having a second and different format. According to an alternate embodiment, the bridge device 200 can be designed to receive global memory control signals having one format, for providing local memory control signals having the same format to the discrete memory devices. In other words, such a composite memory device is configured to receive memory control signals that are used to control the discrete memory devices. Such a configuration allows multiple discrete memory devices to each function as a memory bank operating independently of the other discrete memory device in the composite memory device. Therefore, each discrete memory device can receive its commands from the bridge device 200, and proceed to execute operations substantially in parallel with each other. This is also referred to as concurrent operations. The design of bridge device 200 is therefore simplified, as no command conversion circuitry is required.

The previously described embodiments illustrate how discrete memory devices in a composite memory device can respond to a foreign command format. This is achieved through the bridge device that converts the received global command into a native command format compatible with the discrete memory devices. By example, a serial command format can be converted into an asynchronous NAND flash format. The embodiments are not limited to these two formats, as any pair of command formats can be converted from one to the other.

Regardless of the formats being used, an advantage of the composite memory device according to at least some example embodiments, is that each can be operated at a frequency to provide a data throughput that is significantly higher than that of the discrete memory devices within it. Using the composite memory device of FIG. 3A for example, if each discrete memory device 104 is a conventional asynchronous NAND flash memory device, its maximum data rate per pin is about 40 Mbps. However, the bridge device 102 which receives at least one data stream synchronously with a clock, can be configured to operate at a frequency of 166 MHz, resulting in a minimum 333 Mbps data rate per pin. Depending on the process technology being used to manufacture the bridge device 102, the operating frequency can be 200 MHz or higher to realize even higher data rates per pin. Therefore, in a larger system that uses memory system 300 of FIG. 5 to store data, high speed operations can be obtained. An example application is to use memory system 300 as a mass storage medium in a computing system or other application which demands high performance and large storage capacity.

While the data rate mismatch between the discrete memory device and the bridge device can be significant, the presently shown embodiments of bridge device 102 compensates for any level of mismatch. According to a present embodiment, bridge device 102 pre-fetches and stores a predetermined amount of read data from a selected discrete memory device 104 during a read operation from the corresponding composite memory device 100. The read data is transferred to the bridge device 102 at the maximum allowed data rate for the discrete memory device 104. Once the predetermined amount of read data is stored in bridge device 102, it can be outputted at its maximum data rate without restriction. For a program or write operation to composite memory device 100, bridge device 102 receives the program data at its maximum data rate and stores it. Bridge device 102 then programs the stored data in the selected discrete memory device 104 at the maximum allowed data rate for the discrete memory device 104. The maximum allowed data rate for reading data and programming data from or to the discrete memory device may be standardized or outlined in its documented technical specifications.

Figure 6A:
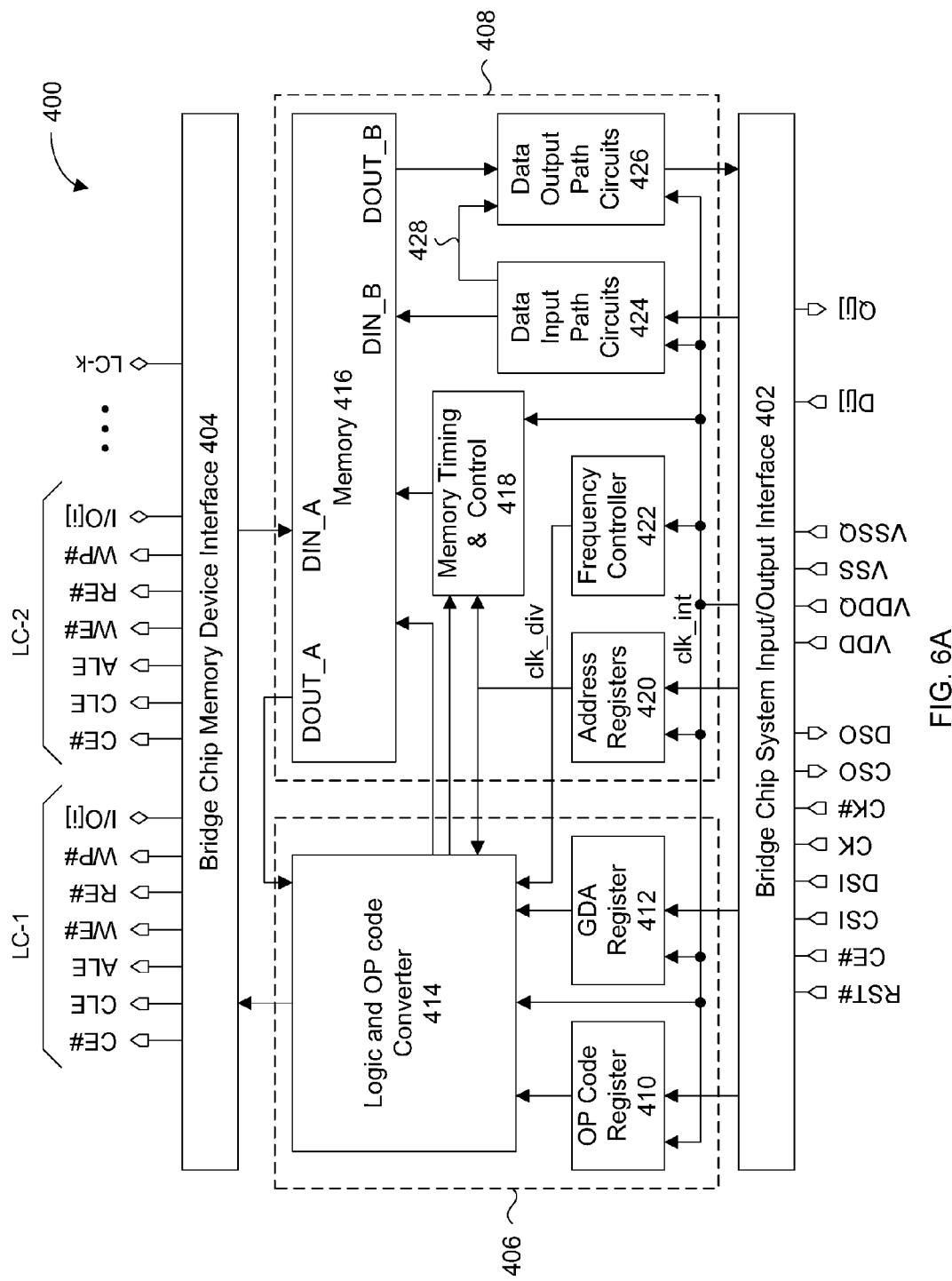
FIG. 6A is a block diagram of a NAND to high speed serial interface bridge device, according to a present embodiment.

While FIG. 4 generally outlines the functional blocks of bridge device 200, FIG. 6A shows a more detailed block diagram of bridge device 200 according to a present embodiment. Bridge device 400 includes four main functional blocks, which correspond to those shown for bridge device 200 of FIG. 4. These are the bridge device system input/output interface 402, the memory device interface 404, the command format converter 406 and the data format converter 408. These blocks have functions which correspond to blocks 202, 204, 208 and 210 of FIG. 4 respectively. The embodiment of FIG. 6A is applied to an example where the composite memory device includes conventional NAND flash memory devices, and the composite memory device itself is configured to have a serial interface corresponding to the serial interface flash memory device of FIG. 2B. Following is a detailed description of blocks 402, 404, 406 and 408.

The bridge device system input/output interface 402 receives global memory control signals having one format, and passes the received global memory control signals and read data from the discrete memory devices, to subsequent composite memory devices. In the present example, these global memory control signals are the same as the identified memory control signals in FIG. 2B, which are described in Table 2. In relation to FIG. 4 using the present example, the global command GLB_IN includes global memory control signals CSI, DSI and D[j] and the passed global command GLB_OUT includes echo versions of the global memory control signals CSI, DSI and D[j] referred to as CSO, DSO and Q[j] respectively. The aforementioned global memory control signals CSI, DSI and D[j] are considered a global command since they are required to enable the bridge device 400 to execute operations.

The bridge device system input/output interface 402 has input and output ports for receiving the signals previously outlined in Table 2. This block includes well known input buffer circuits, output buffer circuits, drivers, control logic used for controlling the input and output buffer circuits, and routing of required control signals to the command format converter 406 and routing of different types of data to and from the data format converter 408. Such types of data include, but are not limited to, address data, read data, program or write data and configuration data for example. The data received at input ports D[j] and provided at output ports Q[j] can be in either the single data rate (SDR) or double data rate (DDR) formats. Those skilled in the art should understand that SDR data is latched on each rising edge of a clock signal, while DDR data is latched on both the rising and falling edges of a clock signal. Hence the input and output buffers include the appropriate SDR or DDR latching circuits. It should be noted that bridge device system input/output interface 402 includes a control signal flow through path that couples the input ports receiving control signals CSI and DSI to corresponding output ports providing echo signals CSO and DSO. Similarly, a data signal flow through path couples the input ports receiving input data stream(s) D[j] to corresponding output ports providing output data stream(s) Q[j]. The output data stream(s) can be either the input data stream(s) received at D[j], or read data provided from a discrete memory device connected to bridge device 400.

In the present example, bridge device 400 receives differential clocks CK and CK# in parallel with other bridge devices in the memory system. Optionally, differential clocks CK and CK# are source synchronous clock signals that are provided from the memory controller, such as memory controller 302 of FIG. 5, and passed serially from one composite memory device to another via their respective bridge devices. In such a configuration, bridge device 400 includes a clock flow through path to couple the differential clocks CK and CK# received at input ports to corresponding output ports (not shown). Commonly owned U.S. Patent Application Publication Number 20090039927 titled "CLOCK MODE DETERMINATION IN A MEMORY SYSTEM" which is incorporated herein by reference, discloses circuits for enabling a serially connected memory device to operate with parallel or source synchronous clocks. Therefore, the techniques taught in U.S. Patent Application Publication Number 20090039927 can be equally applied to the bridge device 400.

The memory device interface 404 provides local memory control signals following a native or local format compatible with the discrete memory devices. This format may be different than the format of the global memory control signals. In the present example, memory device interface 404 has sets of local memory control signals for controlling a corresponding number of conventional NAND flash memory devices, where each set of local memory control signals includes the signals previously outlined in Table 1. In this example and with reference to FIG. 4, each set of local memory control signals provides a local command to a corresponding NAND flash memory device in the composite memory device through the LC port. Therefore, if there are k NAND flash memory devices in the composite memory device, then there are k sets of local commands. In FIG. 6A two full sets of local memory control signals are provided from ports labeled as LC-1 and LC-2, and the last full set of local memory control signals are provided from an output port LC-k. These local commands are provided with the proper sequence, logic states and timing that is compatible with the NAND flash memory devices, such that they will execute the operation coded in the local command.

The memory device interface 404 has output ports for providing the local memory control signals previously outlined in Table 1, and bidirectional data ports I/O[i] for providing write data and receiving read data. This block includes well known input buffer circuits, output buffer circuits, drivers and control logic used for controlling the input and output buffer circuits, and routing of data to and from the data format converter 408. Such types of data include, but are not limited to, address data, read data, and program or write data for example.

The command format converter 406 includes at least an op-code register 410, a global device address (GDA) register 412 and a logic and op-code converter block 414. The data format converter 408 includes a memory 416, a timing control circuit 418 for memory 416, address registers 420, a frequency controller 422, data input path circuitry 424 and data output path circuitry 426.

The frequency controller 422 receives the system clock clk_int, and generates a variable clock clk_div, referred to as the memory clock. Logic and op-code converter block 414 receives memory clock clk_div, while the remaining circuits receive the system clock clk_int. As shown in FIG. 6A for example, the circuits connected to the bridge device system input/output interface 402, which receive control signals and data, or provide control signals and data, operate at the system clock frequency of clk_int. Some of these circuits operate exclusively under the system clock, such as the op-code register 410, the GDA register 412, the address registers 420, the data input path circuits 424 and the data output path circuits 426. There are other circuits which receive both the system clock clk_int and the memory clock clk_div, such as logic and op-code converter block 414. As will be discussed later, the logic and op-code converter block 414 controls memory 416 for data access operations where data is transferred between memory 416 and memory device interface 404. These data access and transfer operations are executed under the memory clock clk_div. Memory operations between memory 416 and bridge device system input/output interface 402 operate under the system clock clk_int. The logic and op-code converter block 414 has logic operating under the system clock frequency of clk_int to properly control memory timing and control circuit 418 and the other aforementioned circuits that receive clk_int.

The command format converter 406 receives the global memory control signals corresponding to a global command, and performs two primary functions. The first is an op-code conversion function to decode the op-codes of the global command to provide local memory control signals in a local command which represents the same operation specified by the global command. This op-code conversion function is executed by internal conversion logic (not shown). For example, if the global command is a request to read data from a particular address location, then the resulting converted local memory control signals would correspond to a read operation from a selected NAND flash memory device. The second primary function is a bridge device control function to generate internal control signals for controlling other circuits of bridge device 400, in response to the global command. This bridge device control function is provided by an internal state machine (not shown) that is pre-programmed to respond to all the valid global commands.

The GDA register 412 stores a predetermined and assigned composite memory device address, referred to as a global device address. This global device address permits a memory controller to select one composite memory device of the plurality of composite memory devices in the memory system to act on the global command that it issues. In otherwords, the two aforementioned primary functions are executed only when the composite memory device is selected. As previously discussed for FIG. 3B, the global command 110 includes a global device address field 116 for selecting a composite memory device for responding to the global memory control signals (GMCS) 112. In the present example, the global command is received as one or more serial bitstreams via data input port D[j], where the global device address is the first part of the global command 110 received by the bridge device 400. Comparison circuitry (not shown) in the logic and op-code converter block 414 compares the global device address in global device address field 116 of the global command 110 to the assigned global device address stored in GDA register 412.

If there is a mismatch between the global device address stored in GDA register 412 and global device address field 116 of the global command 110, then logic and op-code converter block 414 ignores the subsequent global memory control signals received by bridge device system input/output interface 402. Otherwise, logic and op-code converter block 414 latches the op-code in the global command 110 in op-code register 410. Once latched, this op-code is decoded so that the bridge device control function is executed. For example, the latched op-code is decoded by decoding circuitry within logic and op-code converter block 414, which then controls routing circuitry within bridge device system input/output interface 402 to direct subsequent bits of the global command 110 to other registers in bridge device 400. This is required since the global command 110 may include different types of data depending on the operation that is to be executed. In other words, the logic and op-code converter block 414 will know based on the decoded op-code, the structure of the global command before the bits have arrived at bridge device system input/output interface 402. For example, a read operation includes block, row and column address information which is latched in respective registers. An erase operation on the other hand does not require row and column addresses, and only requires a block address. Accordingly, the corresponding op-code instructs the logic and op-code converter block 414 the time at which specific types of address data are to arrive at the bridge device system input/output interface 402 so that they can be routed to their respective registers.

Once all the data of the global command 110 has been latched, then conversion circuitry generates the local memory control signals, having the required logic states, sequence and timing which would be used to execute the same operation in the NAND flash memory device. For any operation requiring access to a particular address location in the NAND flash memory devices, logic and op-code converter block 414 converts the address data stored in the address registers 420 for issuance as part of the local command through the I/O[i] ports. As will be described later, the addresses may access a virtual address space in the NAND flash memory device. This virtual address space is related to the virtual address space in memory 416. Therefore logic and op-code converter block 414 includes configurable logic circuits for converting the addresses into addresses compatible with the NAND flash memory device. The details of how the virtual address space is accessed are not relevant to the present embodiments, and thus are not discussed any further.

In the present embodiment, memory 416 is a dual port memory, where each port has a data input port and a data output port. Port A has data input port DIN_A and data output port DOUT_A, while Port B has data input port DIN_B and data output port DOUT_B. Port A is used for transferring data between memory 416 and the discrete memory devices it is coupled to. Port B on the other hand is used for transferring data between memory 416 and the D[j] and Q[j] ports of bridge device system input/output interface 402. As will be described shortly, Port A is operated at the memory clock frequency, while Port B is operated at the system clock frequency. Data to be programmed to the NAND flash memory device is read out via DOUT_A of memory 416 and provided to logic and op-code converter block 414, which then generates the local memory control signals compatible with the discrete memory device. Read data received from a discrete memory device is written directly to memory 416 via DIN_A under the control of logic and op-code converter block 414. Write data provided from DOUT_A is provided under the control of logic and op-code converter block 414. Details of how Port B is used is described later. Circuits within logic and op-code converter block 414 includes control logic for controlling timing of the application and decoding of addresses, data sensing and data output and input through ports DOUT_A and DIN_A respectively, in synchronization with the memory clock frequency.

In either scenario, the global command instructs the logic and op-code converter block 414 to select a discrete memory device for which the read or write operations are to be executed on, via a set of local memory control signals (LC-1 to LC-k). The local device address (LDA) 118 field of global command 110 is used by logic and op-code converter block 414 to determine which NAND flash memory device is to receive the generated local memory control signals. Therefore, any one set of LC-1 to LC-i are driven with the generated memory control signals in response to a global command 110. The global command further instructs logic and op-code converter block 414 to execute the bridge device control function for controlling any required circuits within bridge device 400 that complement the operation. For example, data input path circuitry 424 is controlled during a write operation to load or write the data received at D[j] into memory 416, before the local memory control signals are generated.

The latched op-code can subsequently enable the op-code conversion function for generating the local memory control signals in a local command. There may be valid op-codes which do not require any NAND flash memory operations, and are thus restricted to controlling operations of bridge device 400. When a read or write operation to the NAND flash memories is requested, logic and op-code converter block 414 controls memory timing and control circuit 418, which in turn controls the timing for writing or reading data from a location in memory 416 based on addresses stored in address registers 420. Further details of these circuits is now follows.

The data format converter 408 temporarily stores write data received from the bridge device system input/output interface 402 to be programmed into the NAND flash memory devices, and temporarily stores read data received from the NAND flash memory devices to be output from bridge device system input/output interface 402. Memory 416 is functionally shown as a single block, but can be logically or physically divided into sub-divisions such as banks, planes or arrays, where each bank, plane or array is matched to a NAND flash memory device. More specifically, each bank, plane or array is dedicated to receiving read data from a page buffer or providing write data to the page buffer of one NAND flash memory device. Memory 416 can be any volatile memory, such as SRAM for example. Because different types of memory may have different timing and other protocol requirements, timing control circuit 418 is provided to ensure proper operation of memory 416 based on the design specifications of memory 416. For example, timing of the application and decoding of addresses, data sensing and data output and input are controlled by timing control circuit 418. The addresses, which can include row and column addresses, can be provided from address registers 420, while write data is provided via data input path circuits 424 and read data is output via data output path circuits 426.

The data input path circuits 424 receives input data from input ports D[j], and because the data is received in one or more serial bitstreams switching logic is included for routing, or distributing, the bits to the various registers, such as the op-code register 410 and address registers 420. Other registers (not shown) such as data registers or other types of registers, may also receive bits of the input data once the op-code has been decoded for the selected composite memory device. Once distributed to their respective registers, data format conversion circuits (not shown) convert the data which was received in a serial format into a parallel format. Write data latched in the data registers are written to memory 416 via port DIN_B for temporary storage under the control of timing control circuit 418, and later output to a NAND flash memory device for programming using the proper command format as determined by logic and op-code converter block 414.

After memory 416 receives read data from a NAND flash memory device from the I/O[i] ports of one set of local memory control signals, this read data is read out from memory 416 via DOUT_B and provided to output ports Q[j] via data output path circuits 426. Data output path circuits 426 includes parallel to serial conversion circuitry (not shown) for distributing the bits of data onto one or more serial output bitstreams to be output from output ports Q[j]. It is noted that data input path circuits 424 includes a data flow through path 428 for providing input data received from the D[j] input ports directly to the data output path circuits 426, for output on output ports Q[j]. Thus all global commands received at the D[j] input ports are passed through to the Q[j] output ports regardless if the embedded global device address field matches the global device address stored in the GDA register 412. In the serially connected memory system embodiment of FIG. 5, the data flow-through path 428 ensures that every composite memory device 304 receives the global command issued by the memory controller 302. Furthermore, any read data provided by one composite memory device 304 can be passed through any intervening composite memory devices to the memory controller 302.

All the circuits mentioned above that are used for transferring the data between memory 416 and ports Q[j] and D[j] are operated synchronously with the system clock clk_int. In particular, the timing control circuit 418 includes control logic for controlling timing of the application and decoding of addresses, data sensing and data output and input through ports DOUT_B and DIN_B respectively, in synchronization with the system clock frequency. The control logic of timing control circuit 418 can be similar to the control logic within logic and op-code converter block 414 that controls operations of memory 416 at the memory clock frequency. Hence logic and op-code converter block 414 can control memory 416 directly.

Figure 6B:
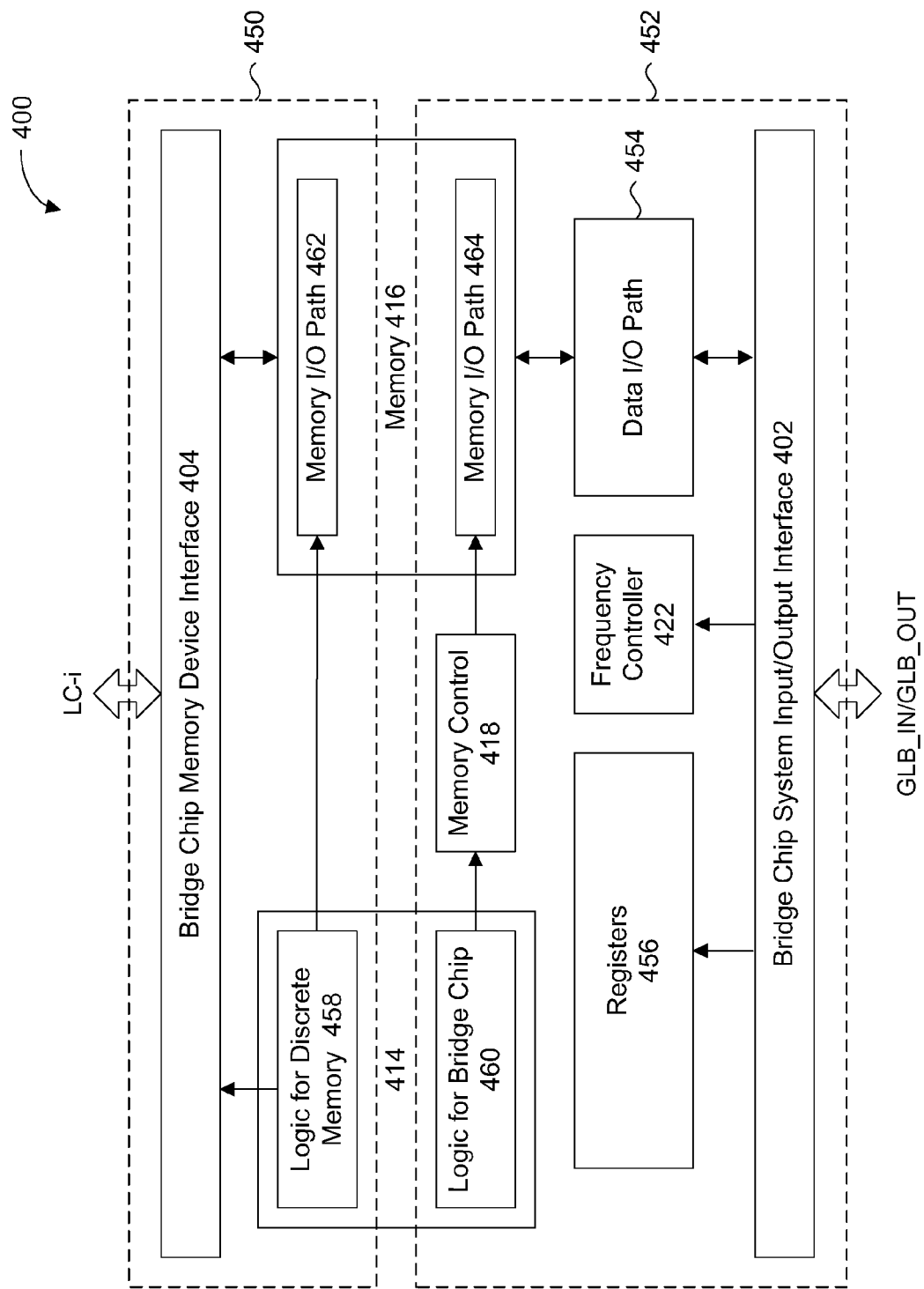
FIG. 6B is a functional block diagram of the bridge device of FIG. 6A showing different clock domains.

It should be understood from the previous description of the embodiment of FIG. 6A that bridge device 400 has two different clock domains, where one clock domain includes circuits which operate at the system clock frequency of clk_int and another clock domain includes circuits which operate at the memory clock frequency of clk_div. FIG. 6B is a functional block diagram representation of the high speed serial interface bridge device embodiment of FIG. 6A, showing the different clock domains within the device. In FIG. 6B, there is a first clock domain 450 and a second clock domain 452. The first clock domain 450 includes circuits operating with the memory clock of clk_div, for interfacing to the discrete memory devices which either operate at or near the frequency of clk_div, or operate at a data rate that corresponds to clk_div. In otherwords, the circuits of the first clock domain 450 operate in synchronization with the memory clock clk_div. The second clock domain 452 includes circuits operating with the system clock clk_int, for interfacing to the memory controller or other controlling device that operates synchronously with a clock that is the same as the system clock clk_int. The circuits of the second clock domain 452 operate in synchronization with the system clock clk_int.

In FIG. 6B, some of the circuit blocks shown in FIG. 6A have been merged together into a single functional block, and some arrows are shown to indicate the general directional flow of data or information. For example, Data I/O Path block 454 includes circuits 424 and 426 of FIG. 6A, while Registers block 456 includes registers 410, 412 and 420. Some of the circuit blocks shown in FIG. 6A have been illustrated with internal blocks. For example, logic and OP code converter 414 is shown to include a first logic block 458 and a second logic block 460. First logic block 458 can include logic circuits for issuing the internal control signals to control memory 416, and logic circuits for executing the aforementioned conversion of commands from one format to a format compatible with the discrete memory devices. The second logic block 460 on the other hand, can include logic circuits for controlling the other circuits of the bridge device 400 in response to a received command at interface 402. The function of logic and OP code converter 414 has been previously described with respect to the other circuits shown in FIG. 6A. Similarly, memory 416 is shown to include a first Memory I/O Path block 462 and a second Memory I/O Path block 464. As previously discussed, memory 416 can be a dual port memory. Therefore, the first Memory I/O Path block 462 operating under the control of first logic block 458 transfers data to and from its memory array at the memory clock frequency of clk_div. On the other hand, the second Memory I/O Path block 464 operates under the control of timing control circuit 418. Hence data is transferred to and from its memory array at the system clock frequency of clk_int.

The first clock domain 450 includes interface 404, first logic block 458 and first Memory I/O Path block 462. The circuits of these blocks operate in synchronization with the memory clock of clk_div. The second clock domain 452 includes interface 402, Registers block 456, frequency controller 422, Memory I/O Path block 454, second Memory I/O Path block 464, timing control circuit 418 and second logic block 460. FIG. 6B is an example embodiment showing specific circuit blocks used in bridge device 400 which are part of either the first or second clock domains. It is noted that any circuit that operates under the memory clock is considered part of the first clock domain 450, while any circuit that operates under the system clock is considered part of the second clock domain 452.

The timing control circuit 418 is designed to operate at a preset maximum system clock frequency, but may be operated at frequencies lower than the preset maximum frequency due to system constraints. In this case for example, if a fixed frequency divider ratio is used to generate the memory clock for the discrete memory devices, the discrete memory devices would also be operating at frequencies less than their respective maximum clock frequency. In a best case scenario for example, if the bridge chip is capable of data rates of 266 Mb/s using a 133 MHz clock, and the discrete memory devices are capable of operating at 40 MHz, a fixed divide ratio of 3.5 could be employed to produce a 38 MHz clock for the discrete memory devices, which in the present example is very close to the maximum allowable speed for the discrete memory devices. The time required for completion of a data read command is the sum of the time required for an internal read operation in the discrete memory device plus the time required to transfer the data from the discrete memory device to the bridge chip. A typical single-bit-per-cell NAND flash device requires 25 μs for the internal read and 100 μs to transfer a 4 kB page over an 8-bit interface at 40 MHz. Therefore the total read time is 125 μs. Now, if the system clock is reduced to 66 MHz for example, the fixed divide ratio of 3.5 would produce a 19 MHz clock for the discrete memory device. Disadvantageously, the transfer time for a 4 kB page would increase to more than 200 μs and the total read time would be more than 225 μs, which is well below the full capability of the discrete memory device. Therefore, a configurable frequency divide ratio can be used to ensure that the discrete memory devices are operated closer to the maximum allowable 40 MHz frequency, thereby reducing the total read time.

In a best case scenario, the circuits of the bridge device can be operated at the maximum system clock frequency that they were designed to operate at. Correspondingly, the discrete memory devices can be operated at their maximum memory clock frequency that they were designed to operate at. Therefore the frequency controller 422 of FIG. 6A generates the memory clock having a frequency that is a ratio of the system clock frequency. In the present embodiments, the ratio between the memory clock frequency and the system clock frequency is configurable to be any one of a preset number of fixed ratios. With each preset ratio, a different set of memory clock frequencies can be generated for each system clock frequency. Table 3 below provides an example illustrating six possible clock divide ratios, and the resulting memory clock frequency clk_div for each clock divide ratio based on a specific system clock frequency clk_int. Different clock divide ratios, and different system clock frequencies other than those shown in Table 3 can be used. The system clock frequencies shown in Table 3 are examples of standardized frequencies presently in use in the semiconductor industry, however the embodiments described herein can be applied to any set of frequencies. The divide ratio of 3.5 has been selected for this example based on the maximum example system clock frequency of 133 MHz, where the known maximum operating frequency of a NAND flash memory device is 40 MHz. The other clock divide ratios of 1.0, 1.5, 2.0, 2.5 and 3.0 are selected to maximize the memory clock frequency for the listed lower system clock frequencies. A programmable frequency allows the data transfer time between discrete memory device and bridge chip to be minimized regardless of system clock frequency.

TABLE 3

| clk_int frequency (MHz) | clk_div frequency (MHz) | | | | | |
|---|---|---|---|---|---|---|
| | /1.0 | /1.5 | /2.0 | /2.5 | /3.0 | /3.5 |
| 40 | 40.0 | 26.7 | 20.0 | 16.0 | 13.3 | 11.4 |
| 50 | NA | 33.3 | 25.0 | 20.0 | 16.6 | 14.3 |
| 66 | NA | NA | 33.0 | 26.4 | 22.0 | 18.9 |
| 83 | NA | NA | NA | 33.2 | 27.7 | 23.7 |
| 100 | NA | NA | NA | 40.0 | 33.3 | 28.6 |
| 125 | NA | NA | NA | NA | NA | 35.7 |
| 133 | NA | NA | NA | NA | NA | 38.0 |

As shown in Table 3, system clock frequencies greater than 40 MHz can have corresponding memory clock frequencies exceeding 40 MHz when certain clock divide ratios are applied to it. These memory clock frequencies are not used for the example NAND flash memory device, and thus noted with "NA" for "not applicable". Conversely, system clock frequencies below 125 MHz can have several different options for a memory clock frequency, depending on the clock divide ratio that is selected. If for example, low power consumption for the NAND flash memory device for a given duration of time is desired, then the lowest possible memory clock frequency is selected, provided such an option is available at the selected system clock frequency. In an alternate application, the maximum memory clock frequency of Table 3 can be set based on the highest maximum operating frequency amongst a group of possible types of discrete memory devices that can be used with the bridge device. This enables configuration of the memory clock to accommodate different discrete memory devices which may operate at different maximum memory clock frequencies. The values of Table 3 can be implemented as a lookup table in a host system or a memory controller. Therefore, a particular clock divide ratio can be selected when a system clock frequency is known and the desired memory clock frequency is known.

Because the clock divide ratios shown in Table 3 are set to be increments of 0.5, the resulting memory clock frequencies may not be an exact frequency match to a desired memory clock frequency. Therefore a lower memory clock frequency closest to the desired memory clock frequency is selected from Table 3. As will be described later, the frequency controller 422 of FIG. 6A for generating 0.5 increment clock divide ratios is a simple logic circuit that minimizes the number of transistors, thereby minimizing silicon area and overall manufacturing cost of the bridge device. While the trade-off in using such a frequency controller circuit appears to be a slight reduction in the memory clock frequency relative to a desired maximum value, the resulting performance impact is minimal.

Figure 7:
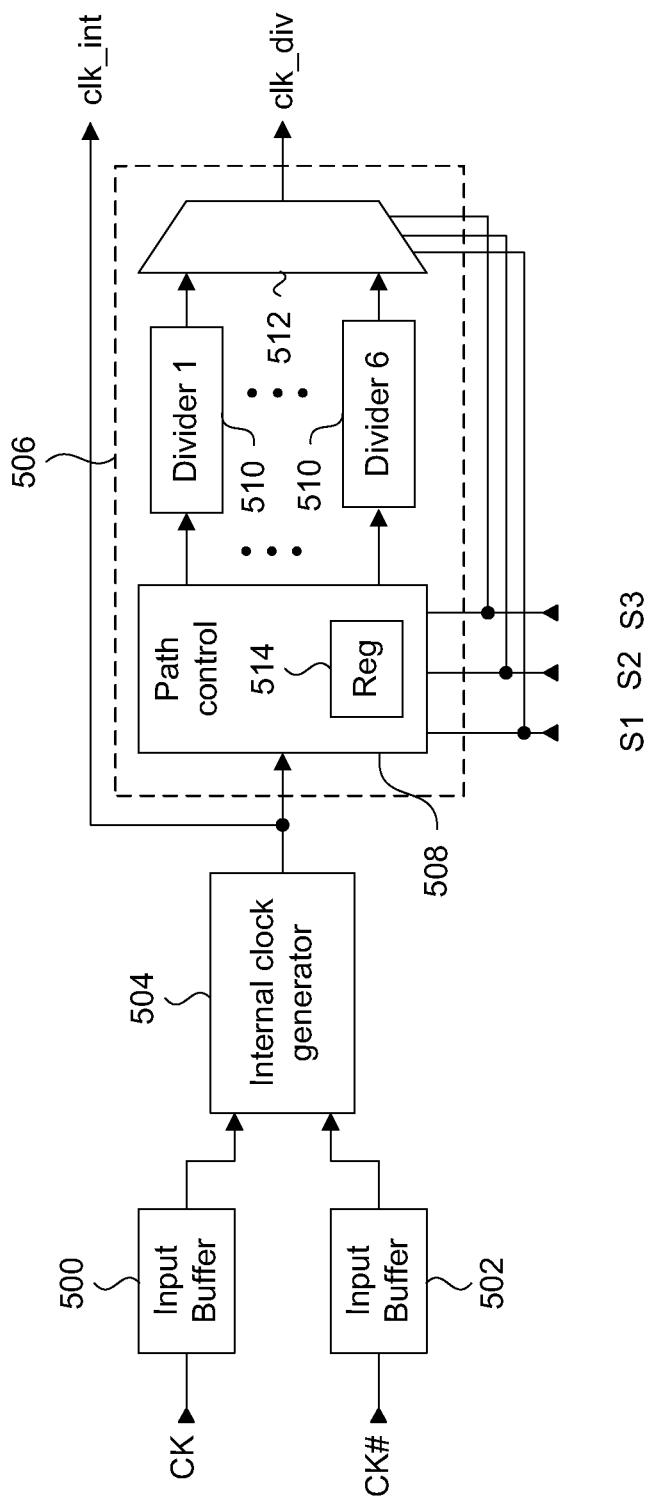
FIG. 7 is a block diagram of the frequency controller shown in FIG. 6, according to a present embodiment.

FIG. 7 is a block diagram showing the clock path between the differential clock input ports CK and CK# of bridge device system input/output interface 402, and an embodiment of frequency controller 422 of FIG. 6A. Differential clock signals CK and CK# have the system clock frequency, and are received by respective clock input buffers 500 and 502. The buffered clock signals are both provided to an internal clock generator 504, which generates a single internal system clock clk_int having the same system clock frequency as CK and CK#. For the purposes of the present discussion, clk_int is a system clock used by the presently described bridge device embodiments. Internal clock generator 504 can receive other control signals to disable the generation of clk_int under certain conditions, such as a power savings mode of operation for example. System clock clk_int is provided to frequency controller 506, which corresponds to frequency controller 422 of FIG. 6A. Frequency controller 506 receives and converts the system clock clk_int into a memory clock clk_div, having frequency that is a selected ratio of the system clock frequency. In the present example embodiment, frequency controller 506 includes a path control circuit 508, a number of clock dividers 510, and a selector 512.

In addition to receiving system clock clk_int, the path control circuit 508 receives a frequency divide ratio (FDR) code, which in the present example is a three bit code represented by bits S1, S2 and S3. The FDR code can be any number of bits. This code is provided in a global command received by bridge device system input/output interface 402, as will be described later in further detail. The FDR code is stored in a register 514 and held therein until a new FDR code is provided during normal operation, or after a reset event. In the present embodiment, path control circuit 508 functions as a demultiplexor for routing or selectively coupling the received clk_int system clock to one of the clock dividers 510 in response to the FDR code. With a three bit FDR code, the path control circuit 508 can select up to eight different paths. The path control circuit 508 includes well known decoding circuitry for executing this 1 of 8 selection functionality. In the present example, there are a total of six different clock dividers 510, where each clock divider 510 divides the system clock by a different ratio to provide a respective intermediate clock signal. With reference to Table 3, each of the six clock dividers 510 provides one of the divide ratios 1.0, 1.5, 2.0, 2.5, 3.0 and 3.5. The outputs of each clock divider 510 is provided to selector 512, which selects which clock divider output to pass as clk_div. Selector 512 receives the same FDR code as path control circuit 508, and can have the same decoding logic formed therein. The frequency controller 506 is scalable, meaning that more than six clock dividers 510 can be included in the circuit, depending on the number of clock divide ratios which are desired. Accordingly, the FDR code can be scaled to include the appropriate number of bits that are required for controlling path control circuit 508 to couple clk_int to one of the clock dividers 510. Alternately, path control circuit 508 can be omitted such that the system clock clk_int is provided in parallel to all clock dividers 510.

Path control circuit 508 can be implemented with any routing circuitry which selectively couples the received clk_int system clock to one specific output. Similarly, each clock divider 510 can be implemented with any circuit that achieves the desired result of reducing the system clock frequency by a fixed ratio. While the embodiment of FIG. 7 is simple to implement, having individual clock dividers 510 and selector 512 may utilize more silicon area than desired. Furthermore, since only one clock divider 510 is ever used for any selected clock divide ratio, the remaining unselected clock dividers 510 are unused, and may contribute to static current leakage. Therefore the occupied area by the unselected clock dividers 510 is not efficiently used.

Figure 8:
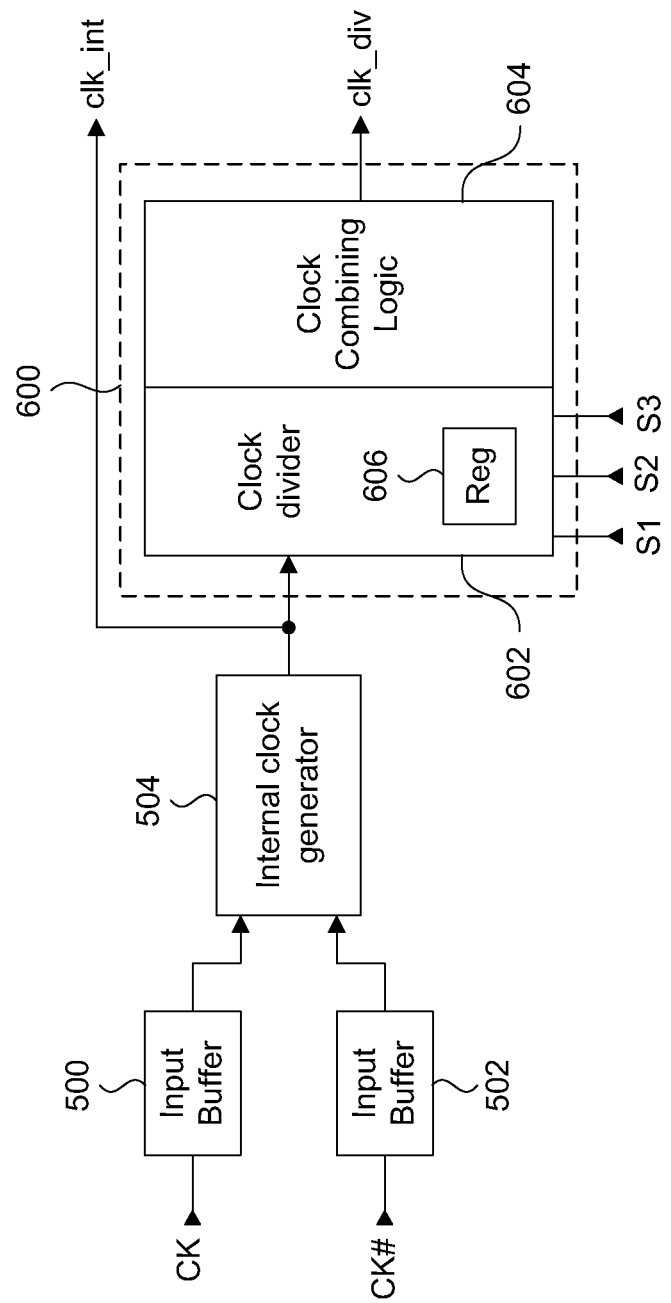
FIG. 8 is a block diagram of an alternate embodiment of the frequency controller shown in FIG. 6A, according to a present embodiment.

FIG. 8 is a block diagram showing the clock path between the differential clock input ports CK and CK# of bridge device system input/output interface 402, and an alternate embodiment of frequency controller 422 of FIG. 6A. Input buffers 500 and 502, and internal clock generator 504 have been previously described in FIG. 7. In the present embodiment, frequency controller 600 includes a clock divider 602 and clock combining logic 604. The function of frequency controller 600 is the same as that of frequency controller 506 of FIG. 7, which is to provide a memory clock clk_div having a frequency that is a ratio of the system clock clk_int. As will be discussed in detail later, clock divider 602 includes configurable logic loop circuits that generate a first set of intermediate clock signals and a second set of intermediate clock signals. The first intermediate set of clock signals are generated in response to a rising edge of system clock clk_int, while the second intermediate set of clock signals are generated in response to a falling edge of system clock clk_int. Hence the first intermediate clock signals are rising edge triggered and the second intermediate clock signals are falling edge triggered. Both the first and second set of intermediate clock signals are generated by independent configurable logic loop circuits, where the number of logic elements in each loop is configurable in response to the FDR code. By changing the number of logic elements in each loop, the frequency of the intermediate clock signals is adjusted.

Clock divider 602 receives the FDR code, which in the present example is a three bit code represented by bits S1, S2 and S3. This code is stored in a frequency register 606. In keeping with the example ratios presented in Table 3, decoding logic within clock divider 602 generates one of six different ratio selector signals corresponding to the divide ratios of 1.0, 1.5, 2.0, 2.5, 3.0 and 3.5. These ratio selector signals are used to configure the number of logic elements in each aforementioned configurable logic loop circuit. The clock combining logic 604 generates memory clock clk_div by logically combining specific intermediate clock signals from the first and the second sets of intermediate clock signals.

Figure 9A:
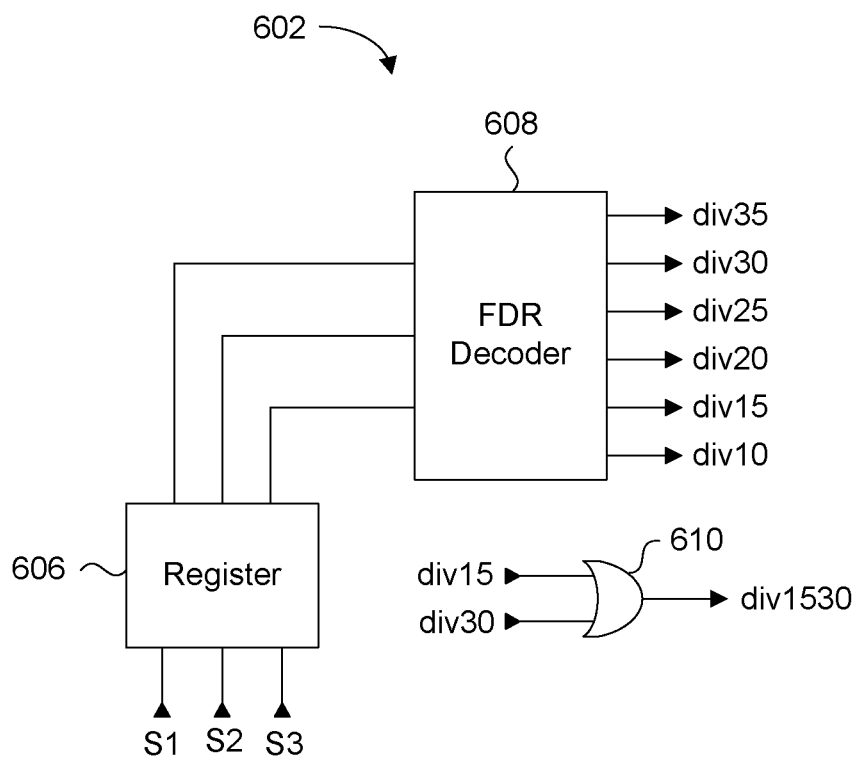
FIG. 9A is a circuit schematic of a frequency divide ratio code decoder in the clock divider of FIG. 8, according to a present embodiment.
Figure 9B:
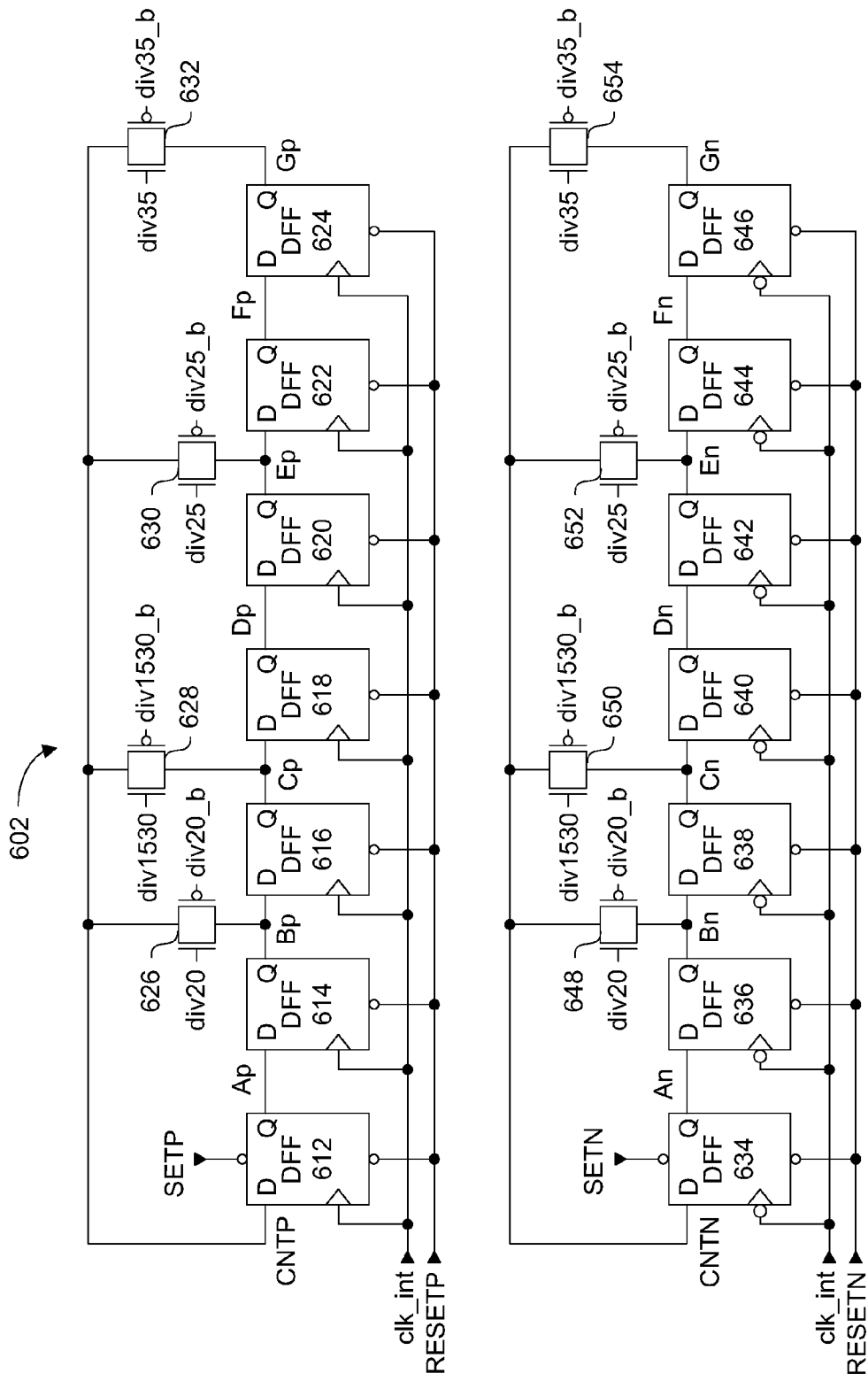
FIG. 9B is a circuit schematic of a configurable clock signal circuit in the path control block of FIG. 8, according to a present embodiment.

FIGS. 9A and 9B are schematics showing the circuits of clock divider 602 of FIG. 8, according to a present embodiment. In FIG. 9A, the frequency register 606 is shown receiving FDR code bits S1, S2 and S3. The stored FDR code bits are provided to FDR decoder 608, which corresponds to the previously discussed decoding logic that generates the six ratio selector signals. These ratio selector signals are div10, div15, div20, div25, div30 and div35, which correspond respectively to the divide ratios of 1.0, 1.5, 2.0, 2.5, 3.0 and 3.5. Those skilled in the art should understand that known logic decoding circuits can be used for generating the ratio selector signals from three bits of data. In particular, with a three bit FDR code, up to 8 different ratio selector signals can be generated. An OR logic gate 610 combines the div15 and div30 ratio selector signals to generate the combined div1530 ratio selector signal.

FIG. 9B is a circuit schematic of two configurable logic loop circuits, each for generating first and second intermediate clock signals. The first configurable logic loop circuit includes seven cascaded logic elements 612, 614, 616, 618, 620, 622 and 624 serially connected to each other in a ring configuration, and loop adjustment circuits for changing the number of logic elements in the loop. Intermediate clock signals Ap, Bp, Cp, Dp, Ep, Fp and Gp may be tapped from the outputs of logic elements 612 to 624 respectively. Intermediate clock signal CNTP is tapped from the input of first logic element 612. Collectively, Ap, Bp, Cp, Dp, Ep, Fp, Gp and CNTP are included in the first set of intermediate clock signals. In the present embodiment each logic element is a flip-flop circuit that latches data on its D-input in response to a first edge of clk_int such as a rising edge of clk_int, which collectively form a shift register. In other words, each of these intermediate clock signals is generated one cycle of the system clock after a previous intermediate clock signal is generated. The Q-output of each flip-flop circuit drives the data latched on its D-input. Flip-flop circuits 612, 614, 616, 618, 620, 622 and 624 are resettable by an active low logic level signal RESETP, which when set to the low logic level, disables all the flip-flop circuits such that their Q outputs are set to the low logic level. Flip-flop circuit 612 is an initializing logic element configured to receive an active low logic level set signal SETP for setting its Q-output to the high logic level on the rising edge of clk_int while SETP is at the low logic level. This initiates the clock generation operation of the first configurable logic loop circuit, which is typically done after all the flip-flop circuits have been cleared by resetting via RESETP.

In alternate embodiments, any equivalent logic element that performs the same function as a flip-flop circuit can be used in the presently shown configurable logic loop circuit, and the shown configurable logic loop circuits can trigger on opposite edges of clk_int. The loop adjustment circuits include transmission gates 626, 628, 630 and 632 which selectively couple the output of different flip-flop circuits to the input of first flip-flop 612. Transmission gate 626 couples the output of flip-flop 614 to the input of flip-flop 612 in response to div20 at the high logic level. An inverter (not shown) inverts div20 to provide its complement div20_b. Transmission gate 628 couples the output of flip-flop 616 to the input of flip-flop 612 in response to div1530 at the high logic level. Transmission gate 630 couples the output of flip-flop 620 to the input of flip-flop 612 in response to div25 at the high logic level. Transmission gate 632 couples the output of flip-flop 624 to the input of flip-flop 612 in response to div30 at the high logic level. For any FDR code, only one of the four transmission gates is turned on. Any activated transmission gate connects the output of the flip-flop it is connected to, to the input of flip-flop 612. Flip-flops connected after the position of the activated transmission gate are effectively removed from the circuit, because their outputs are restricted or inhibited from returning to flip-flop 612. Therefore the frequency of the intermediate signals is adjustable by changing the number of flip-flops, or shifting stages in the loop.

The second configurable logic loop circuit includes seven cascaded logic elements 634, 636, 638, 640, 642, 644 and 646 serially connected to each other in a ring configuration, and loop adjustment circuits 648, 650, 652 and 654 for changing the number of logic elements in the loop. Similar to the first configurable logic loop circuit, the logic elements can be flip-flops which collectively form a shift register and the loop adjustment circuits can be transmission gates. The second set of intermediate clock signals includes CNTN, An, Bn, Cn, Dn, En, Fn and Gn. Intermediate clock signals An, Bn, Cn, Dn, En, Fn and Gn may be tapped off the outputs of flip-flops 634 to 646 respectively. Intermediate clock signal CNTN is tapped from the input of first flip-flop 634. Different combinations of specific signals from the first set of intermediate clock signals with the second set of intermediate clock signals can be used to generate different resulting clock signals, as will be described later. The interconnection of the elements of the second configurable logic loop circuit is virtually identical to those of the first configurable logic loop circuit. For example, the placement of the transmission gates 648, 650, 652 and 654 are the same as transmission gates 626, 628, 630 and 632. The main difference of the second configurable logic loop circuit is that flip-flops 634, 636, 638, 640, 642, 644 and 646 latch data on their D-inputs in response to a second edge of clk_int such as a falling edge of clk_int. In otherwords, each of these intermediate clock signals is generated one cycle of the system clock after a previous intermediate clock signal is generated.

This means that for any given FDR code, the first intermediate clock signals and the second intermediate clock signals will have the same period, but offset from the other by a half clock cycle. Flip-flop circuits 612, 614, 616, 618, 620, 622 and 624 are resettable by an active low logic level signal RESETN, which when set to the low logic level, disables all the flip-flop circuits such that their Q outputs are set to the low logic level. Flip-flop circuit 634 is an initializing logic element configured to receive an active low logic level set signal SETN for setting its Q-output to the high logic level on the falling edge of clk_int while SETN is at the low logic level. This initiates the clock generation operation of the second configurable logic loop circuit, which is typically done after all the flip-flop circuits have been cleared by resetting via RESETN. Therefore, both flip-flops 612 and 634 are configured to respond synchronously to the SETP and SETN signals on respective triggering edges of the clock signal clk_int. According to the present embodiments, SETP and SETN are generated in response to power up of the bridge device, toggling of externally received control signals, or to a change in the FDR code during operation. It is noted that SETP and SETN can be low logic level pulses, each generated at different times. Further discussion of the generation of SETP and SETN is discussed later.

The two configurable logic loop circuits of FIG. 9B can be referred to as a dual shift register clock circuit, where the first configurable logic loop circuit is a positive edge triggering shift register where each flip-flop therein latches on a rising edge of the clock signal clk_int. The second configurable logic loop circuit is a negative edge triggering shift register where each flip-flop therein latches on a falling edge of the clock signal clk_int. The operating principle of the dual shift register clock circuit is now described. In the case of an integer divide ratio, the first configurable logic loop circuit changes the number of its stages in accordance with the selected divide ratio, and generates a positive edge triggering clock signal independently where its period is multiplied by the selected divide ratio. In the case of a non-integer divide ratio, the second configurable logic loop circuit changes the number of its stages with the selected divide ratio, and generates a negative edge triggering clock signal having a frequency that is the divide ratio multiplied by the system clock clk_int and is half the ratio divided frequency. This negative edge triggering clock signal is later merged or combined by a downstream circuit with a clock signal from the first configurable logic loop circuit which is triggering at positive clock edges and also has half frequency of the ratio-divided frequency. By merging clock signals from the positive triggering shift register and the negative triggering shift register, the memory clock signal can be generated which has the ratio divided frequency of the system clock.

Figure 10A:
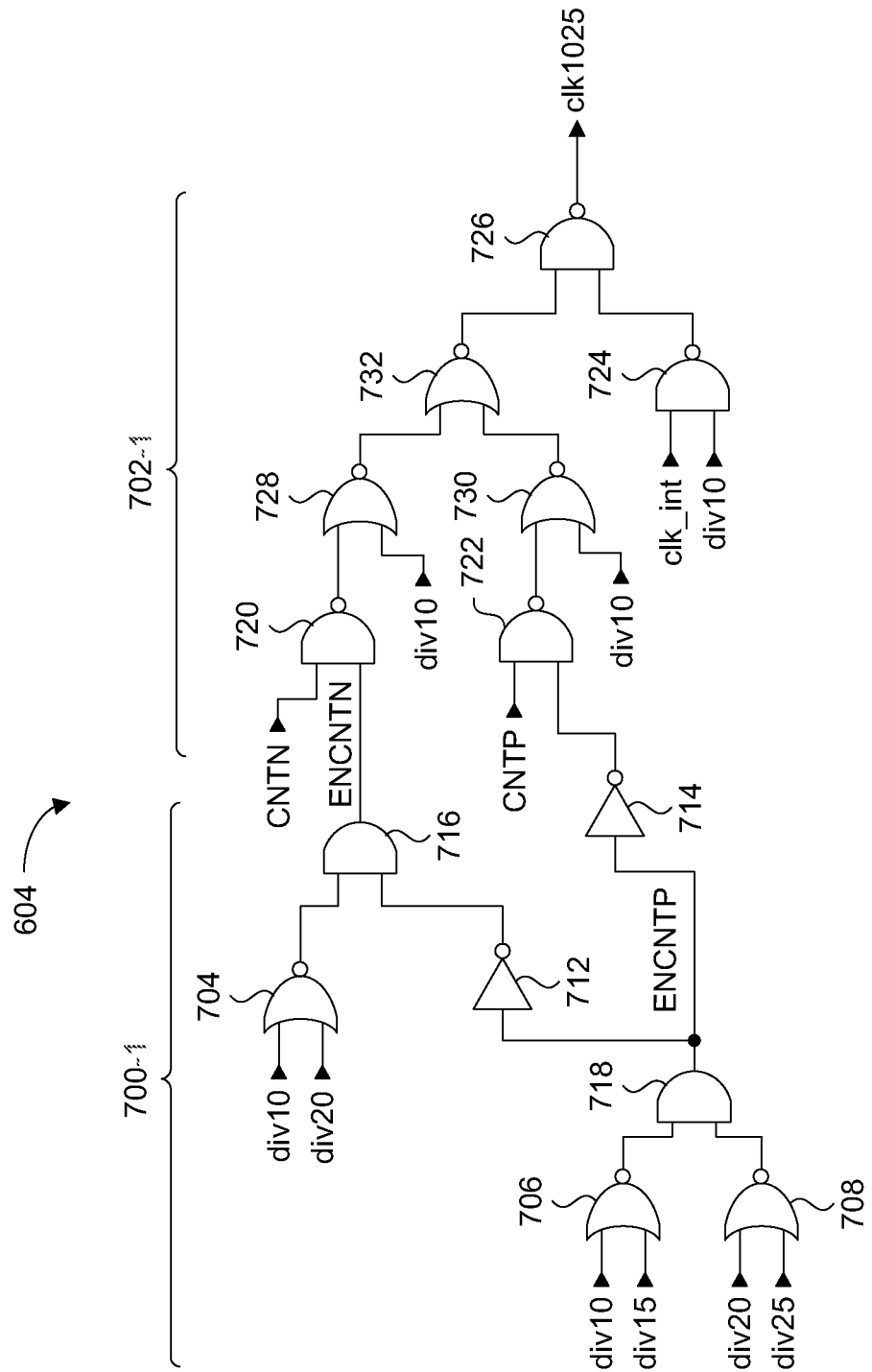
FIGS. 10A and 10B is a circuit schematic of the clock combining logic shown in FIG. 8, according to a present embodiment.
Figure 10B:
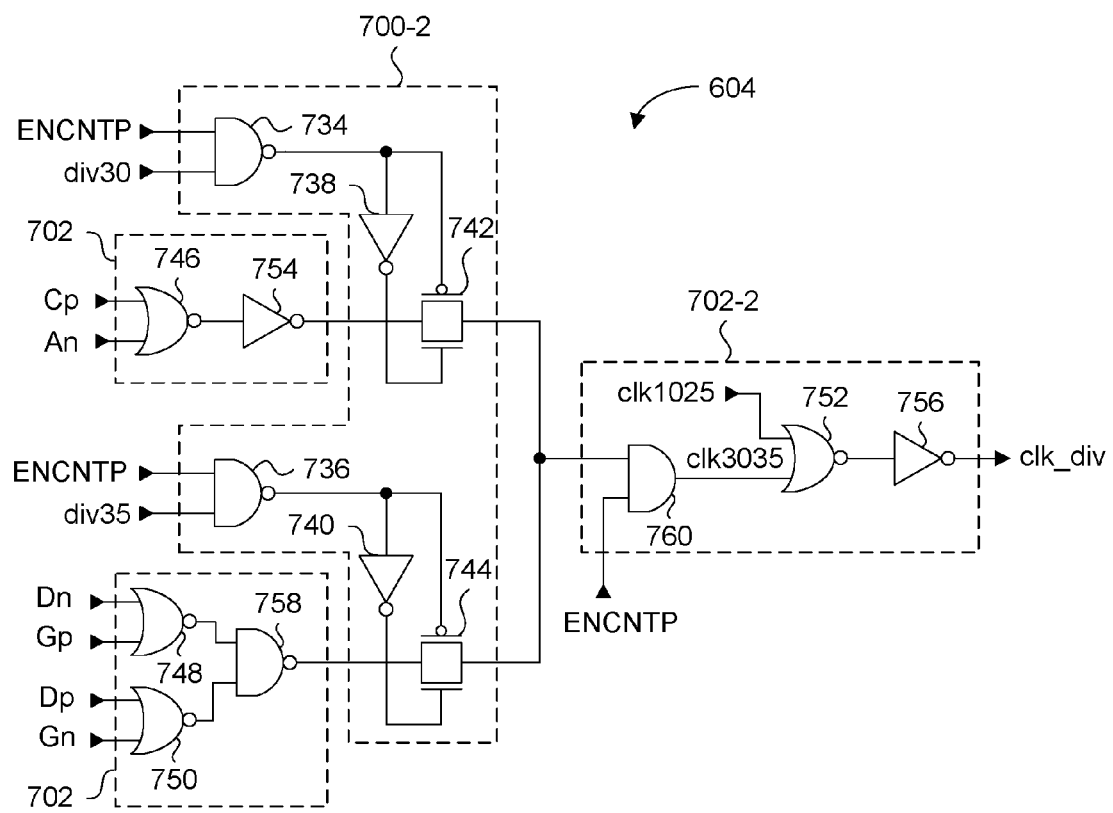

The two configurable logic loop circuits form a first stage of the frequency controller 600. The second stage of the frequency controller 600 is the clock combining logic 604, which generates the memory clock clk_div in response to the first and second set of intermediate clock signals, and the ratio selector signals div10, div15, div20, div25 and div30. The clock combining logic 604 is shown in FIGS. 10A and 10B. FIG. 10A is a circuit schematic showing combinational logic used for generating a first intermediate memory clock clk1025 having a frequency that is a divide ratio of either 1.0, 1.5, 2.0 or 2.5. FIG. 10B is a circuit schematic showing combinational logic used for generating a second intermediate memory clock clk3035 having a frequency that is a divide ratio of either 3.0 or 3.5. Additional logic in the circuit of FIG. 10B passes one of the first or second intermediate memory clocks as the final memory clock clk_div.

With reference to both FIGS. 10A and 10B, the logic gates of clock combining logic 604 are functionally grouped as logic configuration circuitry 700-1, 700-2 and clock generation circuitry 702-1, 702-2. The logic configuration circuitry 700-1, 700-2 generates control signals which configure the logic functions of clock generation circuitry 702-1, 702-2, in response to the divide ratio signals. The clock generation circuitry 702-1, 702-2 receives the first and second intermediate sets of clock signals and logically combines them in accordance with the configured logic function dictated by the control signals from the logic configuration circuitry 700-1, 700-2, and generates the memory clock clk_div. In otherwords, the logic configuration circuitry 700-1, 700-2 enables a predetermined combination of selected intermediate clock signals from the first and second configurable logic loop circuits to be used by clock generation circuitry 702-1, 702-2 for generating the memory clock clk_div.

In FIG. 10A, the logic configuration circuitry 700-1 includes NOR gates 704, 706 and 708, inverters 712 and 714, and AND gates 716 and 718. In FIG. 10A, the clock generation circuitry 702-2 includes NAND gates 720, 722, 724 and 726, NOR gates 728, 730 and 732. In FIG. 10B, the logic configuration circuitry 700-2 includes NAND gates 734 and 736, inverters 738 and 740, and transmission gates 742 and 744. In FIG. 10B, the clock generation circuitry 702-2 includes NOR gates 746, 748, 750 and 752, inverter 754 and 756, and NAND gate 758, and AND gate 760.

Following is a functional description of the logic configuration circuitry 700-1 of FIG. 10A. Logic gates 706, 708 and 718 form a circuit for disabling clock generation circuitry 702-1 of FIG. 10A when all of ratio selector signals div10, div15, div20 and div25 are at a low logic level (for example a voltage corresponding to a logic '0'). In otherwords, logic gates 706, 708 and 718 disables the clock generation circuitry 702-1 of FIG. 10A when one of div30 or div35 are at the high logic level (for example a voltage corresponding to a logic '1'). The output of AND gate 718 is an enable signal, labeled ENCNTP, which is driven to the low logic level when one of div10, div15, div20 and div25 is at the high logic level. Otherwise, ENCNTP is driven to a high logic level when all of div10, div15, div20 and div25 are at the low logic level.

Logic gates 704 and 716 form a circuit for detecting a divide ratio signal corresponding to an integer divide ratio, and in particular to an integer divide ratio less than 3.0. For example, divide ratios of 1.0 and 2.0 are integer divide ratios, while divide ratios 1.5 and 2.5 are fractional divide ratios. When either div10 and div20 are at the high logic level, the enable signal ENCNTN at the output of AND gate 716 is driven to the low logic level. It is noted that while the output of NOR gate 704 is connected to a first input of AND gate 716, a second input of AND gate 716 receives the output of inverter 712, which in turn receives enable signal ENCNTP. Therefore, enable signal ENCNTN is driven to the high logic level only when divide ratio signals div15 or div25 corresponding to fractional divide ratios 1.5 and 2.5 are at the high logic level.

Following is a functional description of the clock generation circuitry 702-1 of FIG. 10A. Clock generation circuitry 702-1 of FIG. 10A includes three clock generation branches. The first branch includes logic gates 720 and 728. The second branch includes logic gates 722 and 730. The third branch includes logic gate 724. Logic gates 726 and 732 combine the outputs of the branches together. The first branch couples intermediate clock signal CNTN received at an input of NAND gate 720 to the output of NOR gate 728 when ENCNTN is at the high logic level. In otherwords, intermediate clock signal CNTN is passed to a first input of NOR gate 732 only for a fractional divide ratio of either 1.5 or 2.5. The second branch couples intermediate clock signal CNTP received at an input of NAND gate 722 to the output of NOR gate 730 when ENCNTP is at the low logic level. In otherwords, intermediate clock signal CNTP is passed to a second input of NOR gate 732 whenever any one of ratio selector signals div10, div15, div20 or div25 are at the high logic level. Therefore, CNTN and CNTP are both coupled to NOR gate 732 in the case when either fractional divide ratio of 1.5 and 2.5 is selected via divide ratio signals div15 and div25 respectively. For all the integer divide ratios except the divide ratio of 1.0, only CNTP is coupled to NOR gate 732. In the case of the divide ratio of 1.0, both the first and the second branches are disabled by having the second inputs of NOR gates 728 and 730 receive the div10 divide ratio signal directly. When div10 is at the high logic level, both NOR gates 728 and 730 drive their outputs to the low logic level. Thus the output of NOR gate 732 is driven to the high logic level. Because div10 is at the high logic level, NAND gate 724 of the third branch is enabled to pass the system clock clk_int. Therefore, when div10 is at the high logic level, the first and the second branches are disabled and clk1025=clk_int, and when div10 is at the low logic level, the third branch is disabled and clk1025 is either CNTP or a logical combination of CNTP and CNTN. The final memory clock clk_div will be intermediate memory clock clk1025 when a divide ratio between 1.0 and 2.5 is selected.

Following is a description of the logic configuration circuitry 700-2 and the clock generation circuitry 702-2 of FIG. 10B. The logic configuration circuitry 700-2 of FIG. 10B is enabled when enable signal ENCNTP is at the high logic level, or more specifically, when only div30 or div35 are at the high logic level. Because only one ratio selector signal is at the high logic level at any one time, when either div30 or div35 is at the high logic level the remaining ratio selector signals remain at the low logic level. With ENCNTP at the high logic level, NAND gates 734 and 736 are enabled. If div30 is at the high logic level, then transmission gate 742 is turned on to pass the output of inverter 754. If div35 is at the high logic level, then transmission gate 744 is turned on to pass the output of NAND gate 758. Therefore the logic configuration circuitry 700-2 of FIG. 10B functions as a selector for coupling one of the two clock generation branches to AND gate 760.

The clock generation circuitry 702-2 of FIG. 10B includes the two clock generation branches mentioned above, and an intermediate memory clock selector circuit. The two clock generation branches of FIG. 10B are referred to as fourth and fifth clock generation branches since the clock generation circuitry 702-1 of FIG. 10A includes first to third clock generation branches. The fourth clock generation branch includes logic gates 746 and 754, and the fifth clock generation branch includes logic gates 748, 750 and 758. In the fourth clock generation branch, NOR gate 746 logically combines intermediate clock signals Cp and An from FIG. 9B with each other. In the fifth clock generation branch, NOR gate 748 logically combines intermediate clock signals Dn and Gp, while NOR gate 750 logically combines intermediate clock signals Dp and Gn, all of which are provided from the circuits of FIG. 9B. The intermediate memory clock selector circuit includes logic gates 760, 752 and 756, where AND logic gate 760 is enabled to pass the outputs of either transmission gates 742 or 744 as intermediate memory clock clk3035 when ENCNTP is at the high logic level. Intermediate memory clock clk3035 is either the system clock divided with the divide ratio of 3.0 or 3.5. NOR gate 752 passes one of the two received intermediate memory clocks clk1025 or clk3035 to inverter 756, which provides the final memory clock clk_div. It should be noted that different logical combinations of signals from first intermediate clock signals and the second intermediate clock signals are possible, depending on the predetermined divide ratios that are designed for the bridge device. For example, these combinations can be selected based on the overlap between logic levels of the different clock signals.

In the present circuit embodiment of FIG. 10B, the intermediate clock signals Cp and An, and Dn, Gp, Dp and Gn, are combined with each other in the manner shown to ensure that the pulse width of the intermediate memory clock clk3035 meets or exceeds a minimum value. In the present embodiments, a pulse width is defined as duration of time between a first rising edge and a subsequent falling edge of a signal (or vice versa). For example, the NAND flash memory standard requires that the pulse width of the WE# or RE# signals are at least 12 ns at frequencies higher than 83 MHz. Therefore, specific intermediate clock signals are selected such that when logically combined together, the pulse width exceeds the minimum required value. While the presently shown example logically combines a specific group of intermediate clock signals with each other, those skilled in the art will understand that different combinations are possible in order to obtain different minimum pulse widths.

In order to ensure that the first and second configurable logic loop circuits of FIG. 9B operate correctly to generate the necessary clock signals for subsequent combination by the clock combining logic of FIGS. 10A and 10B, the starting conditions or states of both configurable loop circuits are set before operation begins. In the present embodiments, such starting conditions are set in response to reset events which can include but are not limited to, power up reset of the bridge device, toggling of an external control signal, or a change to the desired divide ratio of the system clock by way of changing the FDR code. In the present embodiment, provided within the Frequency Controller 422 is a clock Initialization circuit for performing this function.

Figure 11:
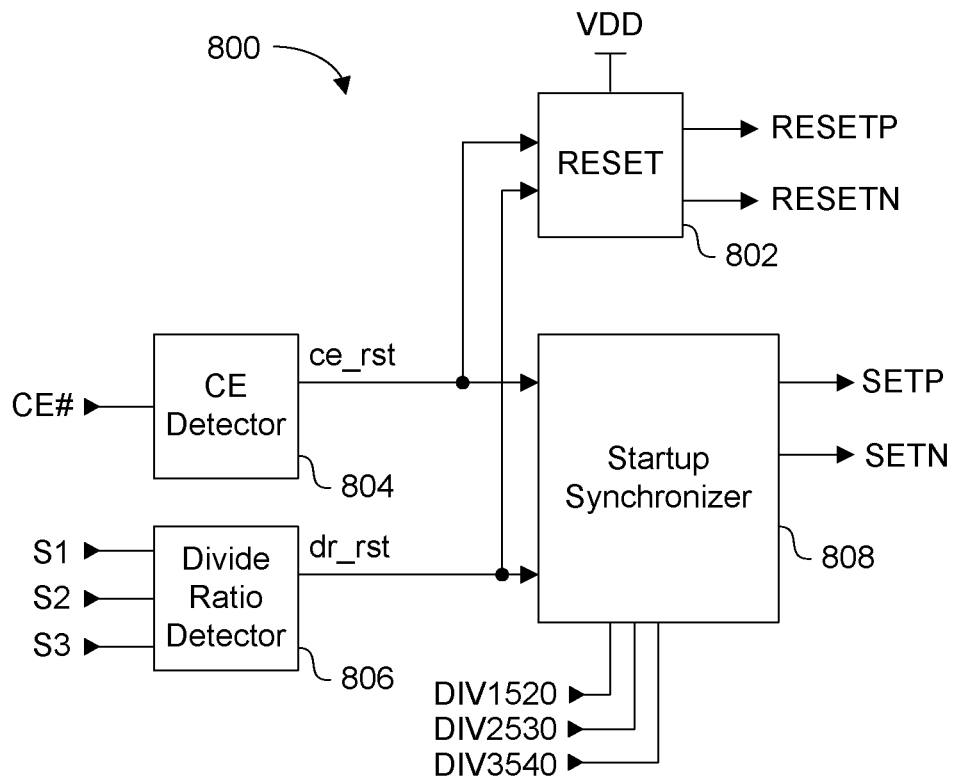
FIG. 11 is a block diagram of a clock initialization circuit for the configurable clock signal circuit of FIG. 9B, according to a present embodiment.

FIG. 11 is a block diagram of the Clock Initialization Circuit according to a present embodiment. Clock initialization circuit 800 is responsible for resetting the first and second configurable logic loop circuits of FIG. 9B and setting the starting conditions for clock generation. In the present embodiment, clock initialization circuit 800 includes a reset circuit 802, an external control signal detector 804, a divide ratio change detector 806, and a startup synchronizer 808. In an example of the present embodiment, the external control signal detector 804 is a chip enable detector, connected to the CE# port of the bridge device 400. Chip enable detector 804 is configured to detect a transition of the CE# port from the high to low logic level, which may occur during read, program or block erase operations. After CE# drops to the low logic level, chip enable detector 804 generates a low logic level pulse referred to as ce_rst. Any external control signal or internal control signal can be detected in a similar manner, depending on the design and application of the bridge device 400. The divide ratio detector 806 detects a change to at least one of the FDR code bits S1, S2 or S3. In response to a detected change, divide ratio detector 806 generates a low logic level pulse referred to as dr_rst.

Reset circuit 802 is responsible for clearing all the flip-flops of the clock divider 602. However, because the first and second configurable loop circuits trigger on different edges of the system clock clk_int, separate reset signals RESETP and RESETN are generated. While both RESETP and RESETN are logically the same, they are generated at different times to properly reset their respective flip-flop circuits, as will be discussed in more detail later. Reset circuit 802 generates RESETP and RESETN in response to power up reset of the bridge device 400, in response to toggling of CE# via ce_rst or in response to a change in the FDR code via dr_rst.

The startup synchronizer 808 generates set signals SETP and SETN in response to either ce_rst or dr_rst. Set signals SETP and SETN are low logic level pulses generated at different times, depending on the selected divide ratio. More specifically, three divide ratio signals determine the spacing of the SETP and SETN pulses from each other. Signal DIV1520 corresponds to a selection of either the divide by 1.5 or 2.0 ratios, signal DIV2530 corresponds to a selection of either the divide by 2.5 or 3.0 ratios, and signal DIV3540 corresponds to a selection of either the divide by 3.5 or 4.0 ratios. Although not explicitly shown, signal DIV1520 is can be a logical OR'ing of signals div15 and div20. Similarly, signal DIV2530 can be a logical OR'ing of signals div25 and div30, and signal DIV3540 can be a logical OR'ing of signals div35 and div40. Such logical OR'ing has been previously shown in FIG. 9A, where signals div15 and div30 are combined at OR gate 610 to form signal div1530. Hence similar OR circuits can be used to generate DIV1520, DIV2530 and DIV3540. For a selected divide ratio of 1.0, all three signals DIV1520, DIV2530 and DIV3540 are at the low logic level. Therefore, selector 870 is responsive to the individual ratio selector signals. The spacing of SETP and SETN is the same for each aforementioned pairing of divide ratios, but will differ between different pairings of ratios.

Figure 12:
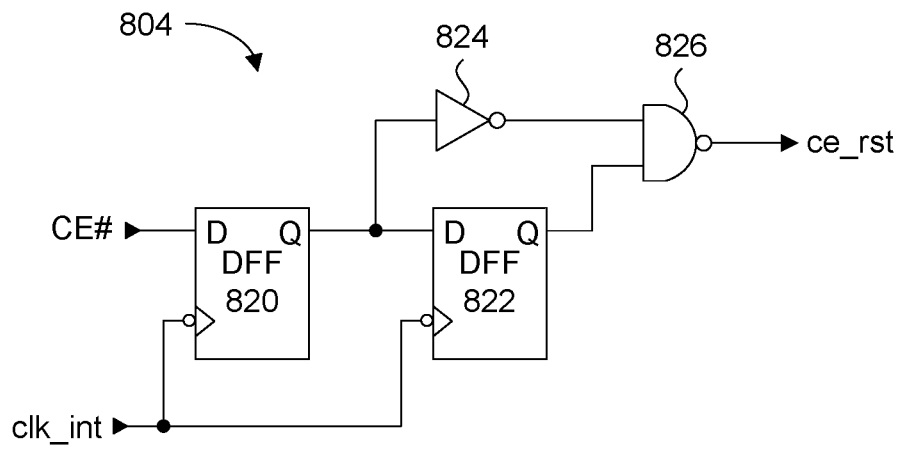
FIG. 12 is a circuit schematic of the external control signal detector of FIG. 11, according to a present embodiment.

FIG. 12 is a circuit schematic of the external control signal detector 804 of FIG. 11, according to a present embodiment. The circuit includes a first flip-flop circuit 820, a second flip-flop circuit 822, and a pulse generator circuit having an inverter 824 and a NAND gate 826. Both flip-flop circuits 820 and 822 are triggered on a falling edge of clk_int to latch its D-input for output on its Q-output. The Q-output of flip-flop circuit 820 is provided to the input of inverter 824, while the Q-output of flip-flop circuit 822 is provided to a first input of NAND gate 826. The second input of NAND gate 826 receives the output of inverter 824. The output of NAND gate 826 is ce_rst, which remains at the high logic level while CE# remains at the low logic level and when CE# transitions from the low logic level to the high logic level. While CE# is at the high logic level, NAND gate 826 receives a low logic level output from inverter 824 and a high logic level output from flip-flop circuit 822. When CE# transitions from the high logic level to the low logic level, inverter 824 changes its output to the high logic level after one falling edge of clk_int, thereby causing NAND gate 826 to drive ce_rst to the low logic level since flip-flop circuit 822 currently outputs a high logic level signal. On a second falling edge of clk_int, flip-flop circuit 822 latches the low logic level output of flip-flop circuit 820 to drive its output to the low logic level. Now NAND gate 826 drives ce_rst back to the high logic level. Hence a low logic ce_rst pulse is generated.

Figure 13:
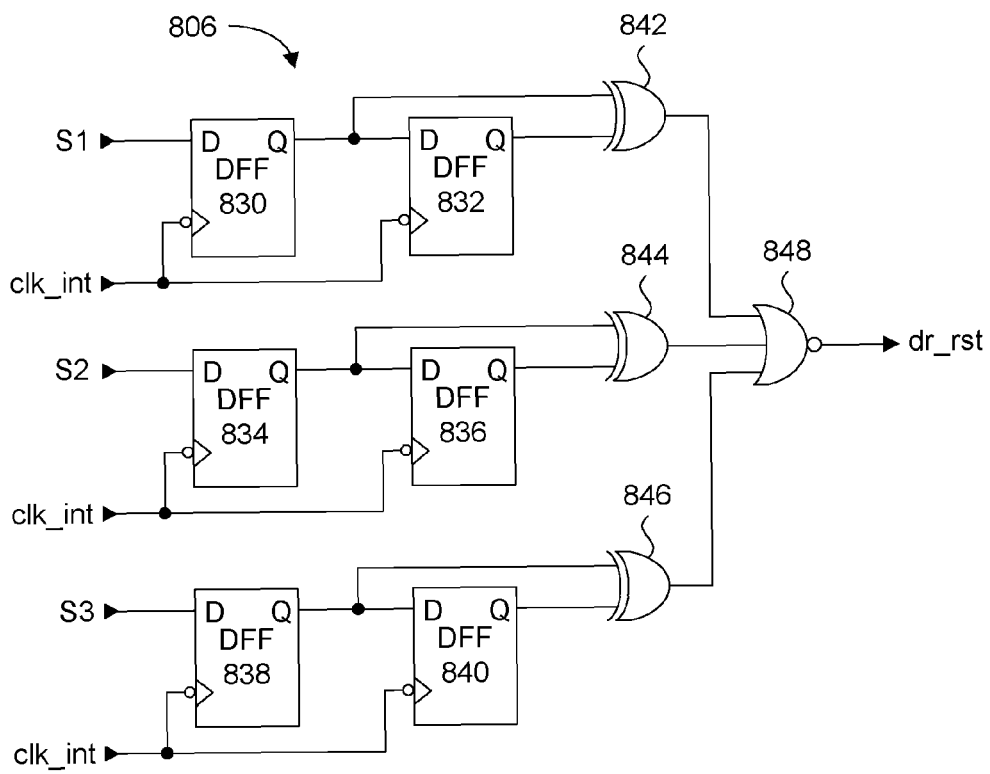
FIG. 13 is a circuit schematic of the divide ratio detector of FIG. 11, according to a present embodiment.

FIG. 13 is a circuit schematic of the divide ratio detector of FIG. 11, according to a present embodiment. The divide ratio detector 806 includes flip-flop circuits 830, 832, 834, 836, 838 and 840, XOR gates 842, 844 and 846, and a NOR gate 848. All the flip-flop circuits are triggered on the falling edge of system clock clk_int. The pair of cascaded flip-flop circuits 830 and 832 having their respective outputs connected to XOR gate 842 forms a single bit change detector for FDR code bit S1. Similarly, cascaded flip-flop circuits 834 and 836 with XOR gate 844 is a single bit change detector for FDR code bit S2, and flip-flop circuits 838 and 840 with XOR gate 846 is a single bit change detector for FDR code bit S3. Using bit S1 by example, when there is no change to its logic state, the output of XOR gates 842 will be at the low logic level as both its inputs will be at the same logic level. However, any change to the logic level of S1 results in a change to the Q-output of flip-flop 830 after a first falling edge of clk_int, thereby causing XOR gate 842 to drive its output to the high logic level because both its inputs are mismatching logic levels. Then after a second falling edge of clk_int, the Q-output of flip-flop 832 changes to the same logic level as S1, thereby placing both inputs of XOR gate 842 in a matching state again. The output of XOR gate 842 falls to the high logic level. Accordingly, each XOR gate 842 generates a high logic level pulse in response to a change to its respective FDR bit. Those skilled in the art should understand that the circuit can easily be scaled to detect more or less FDR bits. The output of each single bit change detector, shown as the outputs of XOR gates 842, 844 and 846, is provided to a result combiner, embodied as NOR gate 848. Any high logic level pulse received from at least one of the single bit change detectors causes NOR gate 848 to generate a complementary low logic level dr_rst pulse. In the present embodiments, the duration of the pulse is one clock cycle or period of clk_int. It is noted that the pulse length can be increased by adding another flip-flop circuit between the input of XOR gate 842 and flip-flop circuit 832.

Figure 14:
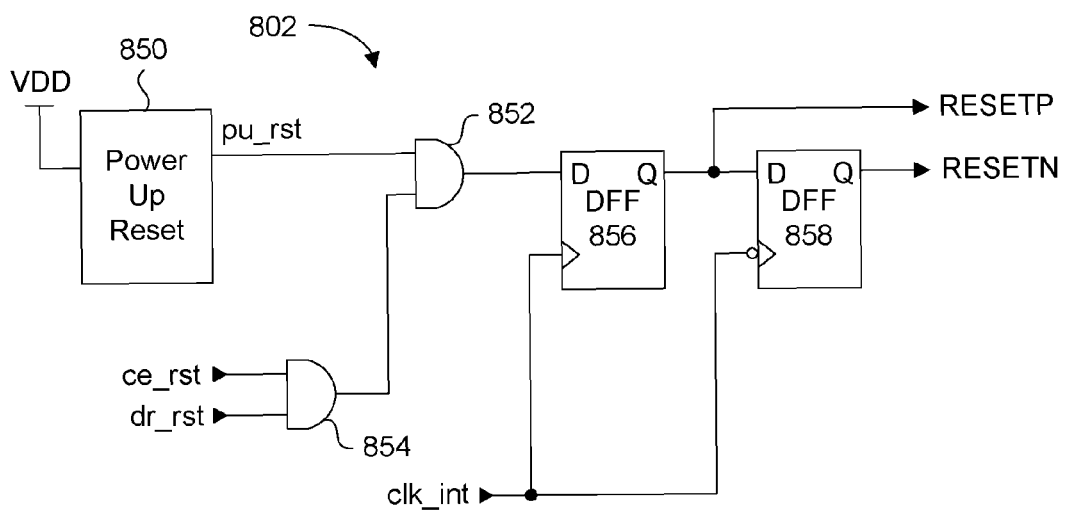
FIG. 14 is a circuit schematic of the reset circuit of FIG. 11, according to a present embodiment.

FIG. 14 is a circuit schematic of reset circuit 802 of FIG. 11, according to a present embodiment. Reset circuit 802 includes a power up reset circuit 850, a detection combiner circuit including AND logic gates 852 and 854, and cascaded flip-flop circuits 856 and 858. Power up reset circuit 850 can include any well known circuits for detecting a predetermined minimum level of the VDD power supply. During power up of bridge device 400, power up reset circuit 850 maintains its output signal pu_rst at the low logic level. When the predetermined minimum level of VDD is reached, pu_rst is driven to the high logic level. AND gates 854 and 856 is a combiner circuit for detecting any one of pu_rst, ce_rst and dr_rst at the low logic level. Therefore, when pu_rst is at the low logic level, the output of AND gate 852 will be at the low logic level. When either ce_rst or dr_rst pulse to the low logic level, the output of AND gate 852 will pulse to the low logic level for the same duration of time. The output of AND gate 852 is provided to flip-flop circuit 856 and the output of 856 is connected to flip flop circuit 858. Flip-flop circuit 856 triggers on the rising edge of system clock clk_int, while flip-flop circuit 858 triggers on the falling edge of system clock clk_int. Therefore, RESETN is driven to the low logic level one half clock cycle after RESETP is driven to the low logic level. Because the pu_rst signal simply transitions from the low to high logic levels as part of the power up process, RESETP and RESETN will simply transition from the low to high logic levels as well. Assuming that the bridge device has been powered up and pu_rst is at the high logic level, a low logic level pulse of ce_rst or dr_rst can be received at AND gate 854. In such a case, RESETP will be a low logic level pulse having the same duration as ce_rst (or dr_rst), while RESETN will be a low logic level pulse having the same duration as ce_rst (or dr_rst), but delayed by one half clock cycle after RESETP.

Thus far, the circuits of FIGS. 12, 13 and 14 contribute to the generation of reset signals RESETP and RESETN for clearing the flip-flop circuits of clock divider 602 in FIG. 9B. Now that the flip-flop circuits have been reset and cleared, the starting conditions for generation of the clock signals by clock divider 602 can be set by generating set signals SETP and SETN. More specifically, the starting conditions for a selected divide ratio are set in response to the relative timing between the low logic level pulses of SETP and SETN. The startup synchronizer 808 is responsible for generating SETP and SETN at specific times in response to the selected divide ratio.

Figure 15:
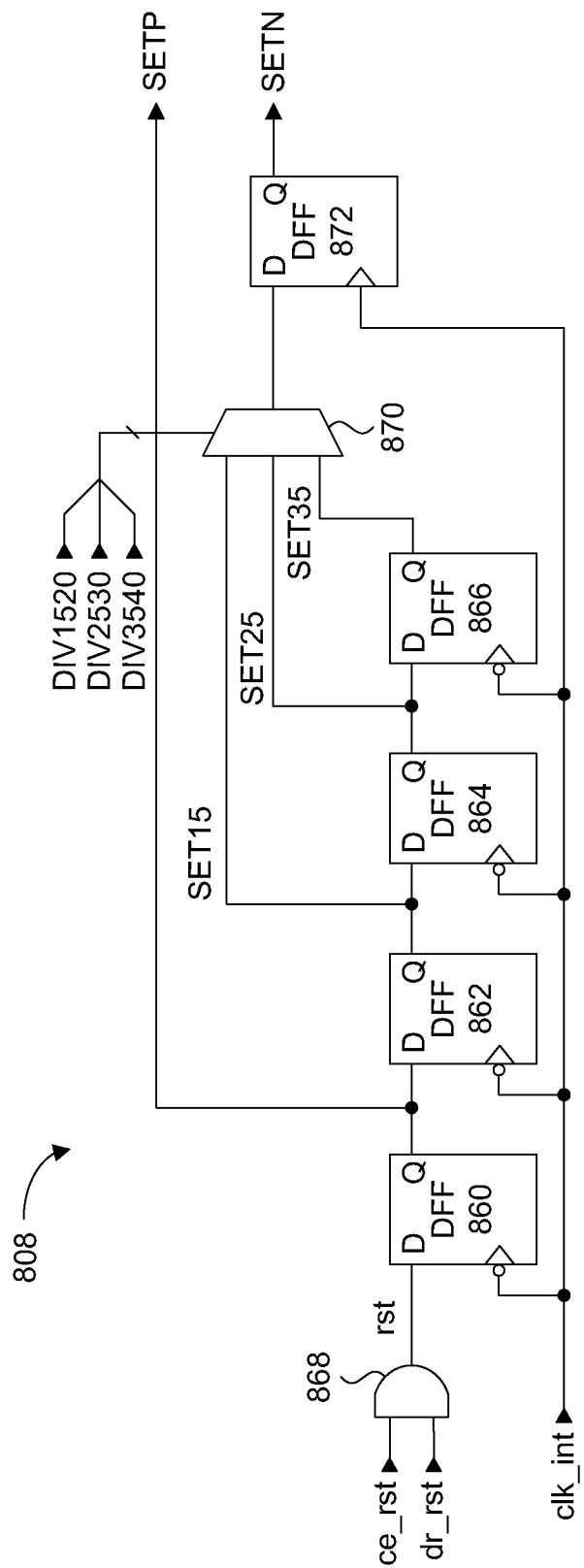
FIG. 15 is a circuit schematic of the startup synchronizer circuit of FIG. 11, according to a present embodiment.

FIG. 15 is a circuit schematic of the startup synchronizer of FIG. 11, according to a present embodiment. Startup synchronizer 808 includes cascaded logic elements such as flip-flop circuits 860, 862, 864 and 866, AND gate 868, selector 870, and flip-flop circuit 872, where logic element 860 is an initializing logic element that generates an initial signal which cascades through the other logic elements. Each of the flip-flop circuits 860, 862, 864 and 866 triggers on the falling edge of the system clock clk_int, but flip-flop circuit 872 triggers on the rising edge of clk_int. AND gate 868 detects the low logic level pulses of either ce_rst or dr_rst, and provides a generic reset pulse rst to the first flip-flop circuit 860. Selector 870 functions as a 3-to-1 multiplexor that receives the outputs of flip-flop circuits 862, 864 and 866, referred to as set configuration signals SET15, SET25 and SET35 respectively, and passes one to flip-flop circuit 872. Selector 870 is configured to have an unselected state where none of the set configuration signals SET15, SET25 and SET35 are passed to flip-flop circuit 872. In this case, the output of flip-flop circuit 872 (SETN) remains at a previously reset state corresponding to the low logic level. The output of flip-flop circuit 860 is used as set signal SETP, while flip-flop circuit 872 functions as a phase adjustment circuit for providing the pulsed signal from selector 870 that is phase shifted by 180 degrees relative to the received pulsed signal. The output of flip-flop circuit 872 is set signal SETN. Selector 870 is configured to be responsive to one of 3 selection signals. The mapping of the selection signals to the inputs to be passed to flip-flop circuit 872 is as follows. Signal DIV1520 passes SET15, signal DIV2530 passes SET25, and signal DIV3540 passes SET35.

Instead of using 3 separate selection signals, selector 870 can be configured to receive a 2-bit signal coded to correspond to any one of the three states, or selection signals for achieving the same function. In this embodiment, a 2-bit signal can be used to represent a total of four different states. Therefore if the selected divide ratio is 1.0, then a fourth state can be entered where selector 870 passes none of the set configuration signals SET15, SET25 and SET35.

Figure 16A:
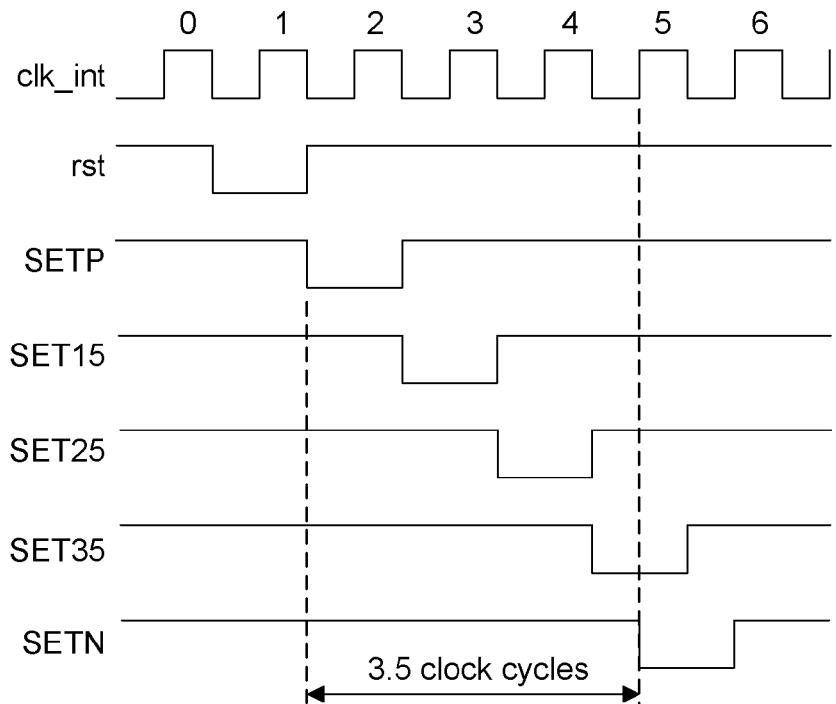
FIGS. 16A and 16B are timing diagrams showing a non-integer divide operation.

An example operation of startup synchronizer 808 is now discussed with reference to the timing diagram of FIG. 16A. It is assumed in this example that DIV3540 is the active selection signal for passing SET35 to flip-flop circuit 872. When a low logic level pulse of either ce_rst or dr_rst is received at AND gate 868, the generic reset signal rst pulses to the low logic level at the first falling edge of clock cycle 0 of clk_int. In the present example, the ce_rst or dr_rst pulses are one clock cycle in duration. The rst pulse then propagates through each of flip-flop circuits 860, 862, 864 and 866 with each successive falling edge of clk_int. At the first rising edge of clock cycle 5, flip-flop circuit 872 latches SET35 via selector 870, thereby providing SETN. As shown in FIG. 16A, SETN is separated or delayed from SETP by a total of 3.5 clock cycles.

Figure 16B:
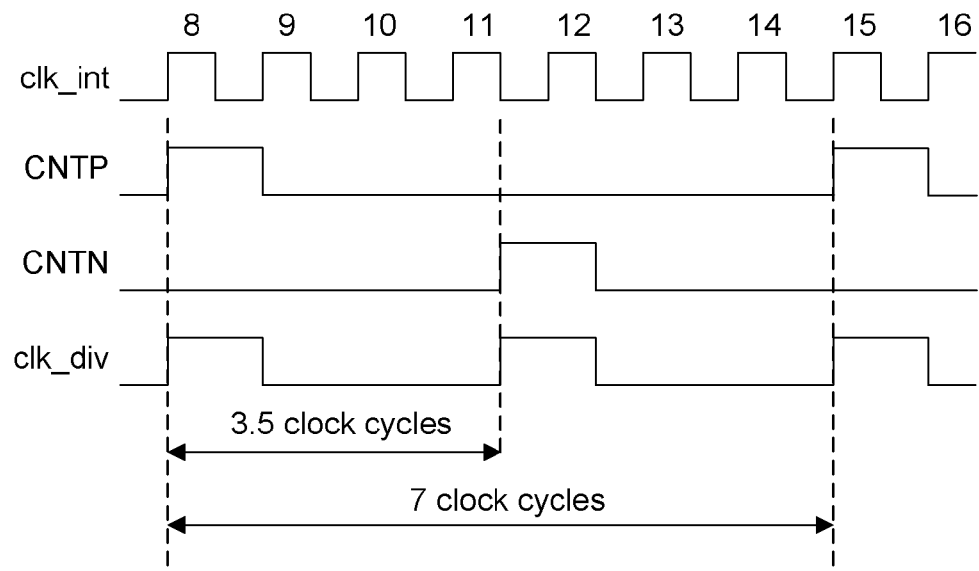

In clock divider 602, ratio selector signal div35 is active to turn on transmission gates 632 and 654, and flip-flop circuits 612 and 634 receive the SETP and SETN low logic level pulses respectively to initiate operation of the circuits. The first and second configurable logic circuits are thus configured as respective 7 stage shift registers. Eventually, the first configurable logic loop generates clock signal CNTP with a 7 system clock period, while the second configurable logic loop generates clock signal CNTN with a 7 system clock period. FIG. 16B is an extension of the timing diagram of FIG. 16A which ends after clock cycle 6. The timing diagram of FIG. 16B begins at clock cycle 8, and illustrates the relationship between CNTP and CNTN where a divide ratio of 3.5 has been selected, and in response to SETP and SETN generated as shown in FIG. 16A. There are no signal transitions between clock cycles 6 and 8. Clock signal CNTP rises to the high logic level at the rising edge of clock cycle 8, which is 7 clock cycles from the rising edge of clock cycle 2. As shown in FIG. 16B, CNTP and CNTN are reciprocally triggering intermediate clock signals with an interval of their half cycle, which enables non-integer clock dividing. This is due to set signal SETN being generated at 3.5 clock cycles after SETP is generated, thus delaying the initial operation of the second configurable logic loop by 3.5 clock cycles relative to the first configurable logic loop. The clock signals generated in clock divider 602 are then logically combined in clock combining logic 604, resulting in a final memory clock clk_div. With reference to FIGS. 15 and 16A, it should be apparent that through selector 870, the initial operation of the second configurable logic loop can also be delayed relative to the initial operation of the first configurable logic loop by 1.5 or 2.5 clock cycles.

In summary, the clock initialization circuit 800 establishes a clock cycle offset between the intermediate clock signals of the first configurable logic loop and the second configurable logic loop of the clock divider 602. The clock combining logic then combines the different intermediate clock signals based on the selected divide ratio to generate the memory clock clk_int.

Figure 17:
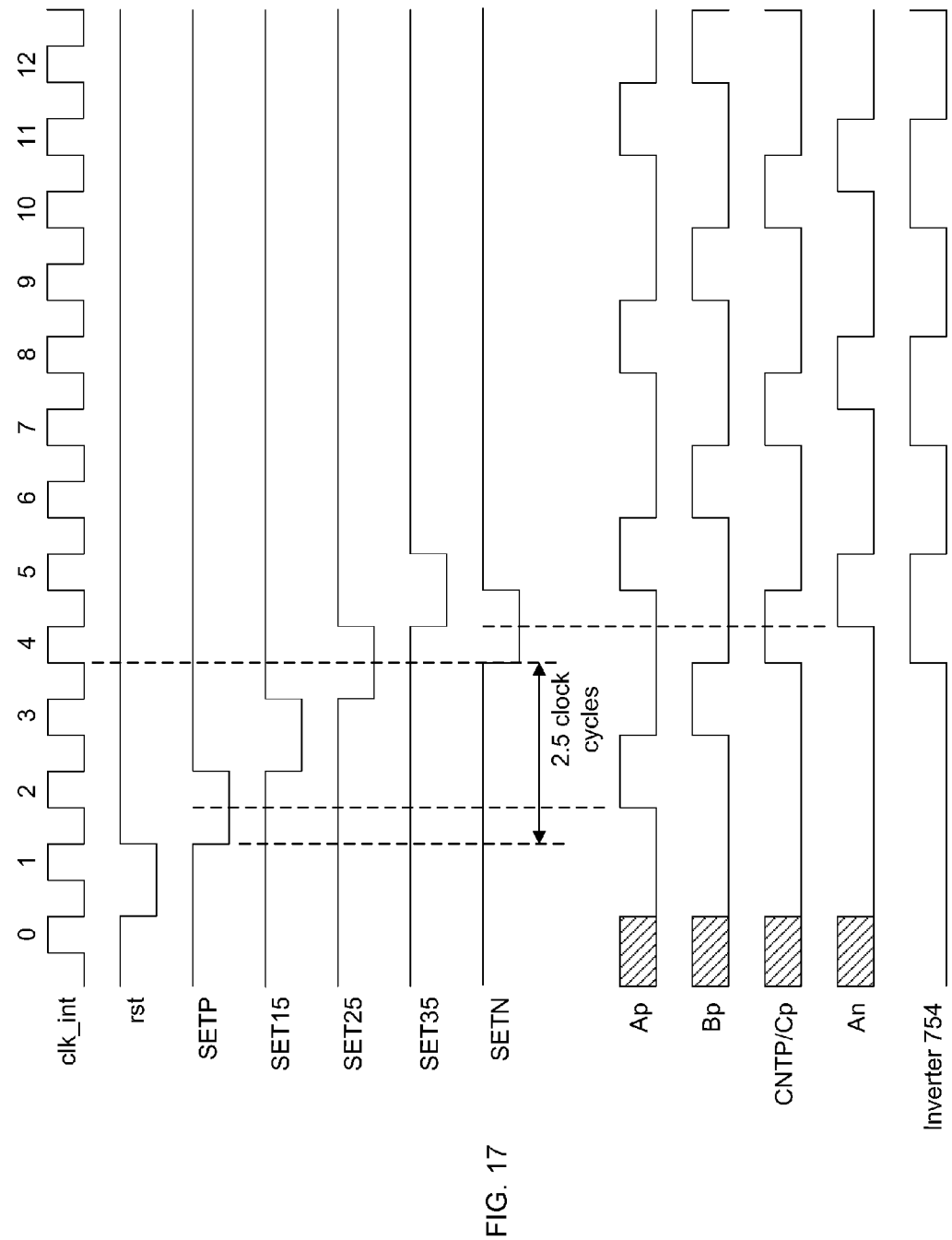
FIG. 17 is an example timing diagram showing an integer divide operation.
Figure 18:
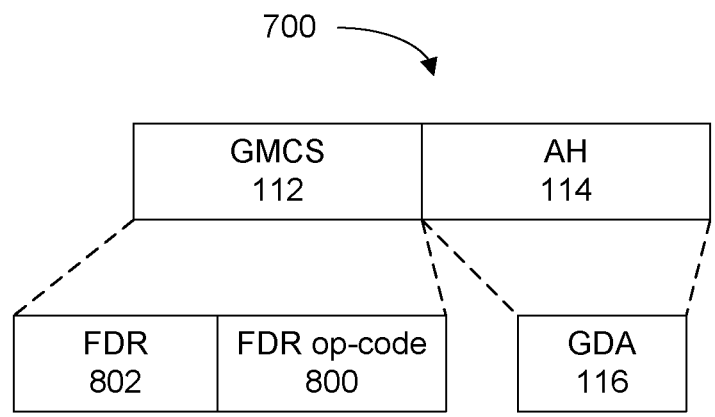
FIG. 18 is an illustration of a frequency configuration command, according to a present embodiment; and, FIG. 19 is a timing diagram illustrating how the clock configuration global command is received by a composite memory device.

An example of how the above described circuits generate clk_int based on an integer based divide ratio follows with reference to the timing diagram of FIG. 17. It is assumed that the integer divide ratio of 3.0 is selected. Hence for the present example, the divide ratio of 3.0 is selected by driving div30 to the high logic level. In the clock divider 602, transmission gate 628 is turned on to configure the first and second configurable logic loops as respective 3 stage shift registers. FIG. 18 shows signal traces for system clock clk_int, the output signals shown in startup synchronizer 808 of FIG. 15, intermediate clock signals Ap, Bp, Cp and An from clock divider 602 of FIG. 9B, and the resulting output of inverter 754 also from FIG. 9B. In the present example, signal ENCNTP is at the high logic level and signal clk1025 is at the low logic level in response to the selected divide ratio, therefore the resulting clk_div signal is equivalent to the output of inverter 754. The sequence and timing of the generation of set configuration signals SET15, SET25 and SET35 is the same as shown in FIG. 16A. However, because of the selected 3.0 divide ratio, divide ratio signal DIV2530 is asserted to cause selector 870 to pass SET25 to flip-flop circuit 872. Accordingly, SETN is generated 2.5 clock cycles of clk_int after the generation of SETP as shown in FIG. 17.

With SETP at the low logic level, flip-flop 612 latches and drives Ap to the high logic level at the first rising edge of clock cycle 2 while ignoring its D-input. In otherwords, SETP at the low logic level overrides the D-input with a high logic level signal, which is latched and provided on the Q-output on the rising edge of clk_int. Intermediate clock signals Bp and Cp (CNTP) are subsequently generated on following rising edges of clk_int. Signal SETN has the same effect on flip-flop 634, as SETP on flip-flop 612. At the first falling edge of clock cycle 4, An is generated. As shown in FIG. 17, Ap, Bp, Cp are offset by one full clock cycle, and An is offset from Cp by a half clock cycle. The pulse duration of these intermediate clock signals is 1 clock cycle. When An and Cp are logically combined by NOR gate 746, the overlapping high logic levels of An and Cp are logically OR'd together by NOR gate 746, or merged to form a high logic level pulse that is 1.5 clock cycles long. The clock output of inverter 754, which is substantially equal to clk_div in the present example, has a period equal to three full clock cycles of clk_int.

As previously discussed, the memory clock frequency is dynamically configurable in the present embodiments, meaning that the memory clock can be set and re-set any time after the composite memory device is powered up. With reference to FIG. 6A, the logic and op-code converter block 414 is configured to receive a clock configuration global command from a memory controller or other host device that it is connected to. FIG. 18 is an illustration of a global frequency configuration command, according to a present embodiment. The global frequency configuration command follows the same basic structure as global command 110 previously shown in FIG. 3B, and includes at least three fields. The first field is the GDA field 116 in the address header 114, followed by an FDR op-code field 900, which is followed by an FDR code field 902. In the presently shown embodiments, the FDR op-code field 900 includes an op-code for instructing control logic within logic and op-code converter block 414. This includes latching the FDR code, such as a three bit code as shown in the example embodiments of FIGS. 7 to 9A that is provided in FDR code field 902. The GDA field 116 has the same purpose as first described in FIG. 3B. Therefore, each composite memory device can be configured to have a different memory clock. Furthermore, GDA field 116 can include a broadcast address that is recognized by all the composite memory devices in the system, so that each composite memory device configures its memory clock with the same FDR code.

Figure 19:
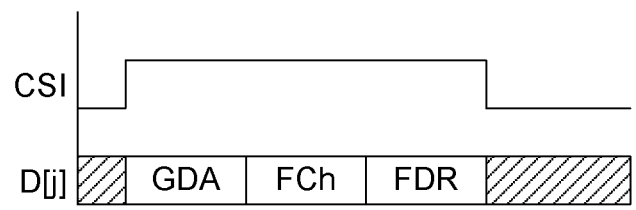

FIG. 19 is a timing diagram illustrating how the clock configuration global command is received by a composite memory device, and more specifically by the presently described bridge device embodiments. The timing diagram shows signal traces for strobe signal CSI, and the input port D[j]. Starting from the left side of the timing diagram, CSI is driven to the high logic state at the same time the GDA is asserted onto the D[j] input port. Once the bridge device has determined a match between the received GDA and its stored address in its GDA register, such as GDA register 412 of FIG. 6A, the FDR op-code is latched. In this example the FDR op-code is represented by hexadecimal string FC. In response to the FDR op-code the control logic of the bridge device, such as logic and op-code converter block 414 of FIG. 6A, controls the routing of the received FDR code to the clock controlling circuitry, such as frequency controller 422 of FIG. 6A. The FDR code is latched and the memory clock frequency is adjusted.

As previously mentioned, the memory clock frequency and the system clock frequency can be automatically adjusted in response to operating conditions, such as temperature or process variation occurring during fabrication. The process variation can be determined using well known testing techniques before the bridge device is packaged. Then the package can be labeled with the recommended valid operating frequencies. To sense ambient temperature, the memory system can include a sensor that monitors the temperature of the system, and the memory controller can include algorithms for determining an increase or decrease in one or both of the system clock frequency or memory clock frequency. Temperature sensors for monitoring temperature of semiconductor devices are well known in the art. A power saving algorithm can be employed to reduce one or both of the system clock and memory clock frequencies, either in response to a user setting or automatic sensing of a voltage level of a battery supply. For example, when the battery voltage falls to a predetermined threshold, the clock frequencies can be reduced.

In the preceding description, for purposes of explanation, numerous details are set forth in order to provide a thorough understanding of the embodiments of the invention. However, it will be apparent to one skilled in the art that these specific details are not required in order to practice the invention. In other instances, well-known electrical structures and circuits are shown in block diagram form in order not to obscure the invention.

It will be understood that when an element is herein referred to as being "connected" or "coupled" to another element, it can be directly connected or coupled to the other element or intervening elements may be present. In contrast, when an element is herein referred to as being "directly connected" or "directly coupled" to another element, there are no intervening elements present. Other words used to describe the relationship between elements should be interpreted in a like fashion (i.e., "between" versus "directly between", "adjacent" versus "directly adjacent", etc.).

Certain adaptations and modifications of the described embodiments can be made. Therefore, the above-discussed embodiments are considered to be illustrative and not restrictive.

What is claimed is:

1. A bridge device for controlling a plurality of discrete memory devices, the bridge device comprising:
a first clock domain having first logic circuits and first control circuits to operate in synchronization with a memory clock for issuing local commands to the discrete memory devices;
a frequency controller for generating the memory clock using one of at least two clock divide ratios of a system clock to be provided to the bridge device; and a second clock domain having second logic circuits and second control circuits to operate in synchronization with the system clock for converting-global commands to be received synchronously with the system clock into the local commands synchronized with the memory clock; and a plurality of sets of dedicated local input/outputs, each of the plurality of sets of dedicated local input/outputs being configured to couple a respective local command of the local commands and respective data between a respective one of the discrete memory devices and the bridge device, whereby each of the plurality of discrete memory devices has a respective input/output port that is independently accessible, to the bridge device, amongst input/output ports of the plurality of discrete memory devices.

2. The bridge device of claim 1, wherein the bridge device further includes a memory for storing write data received by at least one system data input port to be provided to the discrete memory devices, and for storing read data received from the discrete memory devices to be provided to at least one system data output port.

3. The bridge device of claim 2, wherein the memory includes a first memory input/output path controlled by the first control circuits of the first clock domain for providing the write data stored in a memory array of the memory to the discrete memory devices at a first data rate corresponding to a frequency of the memory clock, and for receiving the read data at the first data rate for writing to the memory array.

4. The bridge device of claim 3, wherein the memory includes a second memory input/output path controlled by the second control circuits of the second clock domain for providing the write data to the memory array at a second data rate corresponding to a frequency of the system clock, and for providing the read data from the memory array at the second data rate.

5. The bridge device of claim 4, wherein the second clock domain further includes data input path circuits for providing the write data received at the at least one system data input port to the second memory input/output path, and data output path circuits for providing the read data provided by the second memory input/output path to the at least one system data output port, the data input path circuits and the data output path circuits operating in synchronization with the system clock.

6. The bridge device of claim 2, wherein the second logic circuits and the second control circuits include conversion circuits for converting commands of the global commands into the local commands compatible with the discrete memory devices synchronously with the system clock.

7. The bridge device of claim 6, wherein the first logic circuits and the first control circuits are configured for providing the local commands to the discrete memory devices synchronously with the memory clock.

8. The bridge device of claim 7, wherein the first logic circuits and the first control circuits receive write data from the memory for output to the discrete memory devices synchronously with the memory clock when a local command of the local commands corresponds to a write operation for a selected discrete memory device.

9. The bridge device of claim 1, wherein the second clock domain further includes an operational code register receiving and storing a frequency divide op-code for controlling the frequency controller to change a divide ratio of the system clock to a ratio corresponding to a received frequency divide ratio code, and a register for receiving and storing the frequency divide ratio code.

10. The bridge device of claim 9, wherein the frequency divide ratio code includes multiple bits corresponding to integer and non-integer divide ratios.

11. The bridge device of claim 1, wherein the frequency controller includes clock dividers each configured to divide the system clock by different integer and non-integer divide ratios to provide intermediate clock signals, and a selector for passing one of the intermediate clock signals as the memory clock in response to a frequency divide ratio code corresponding to any one of the different integer and non-integer divide ratios.

12. The bridge device of claim 11, the frequency controller includes a path control circuit for selectively passing the system clock to one of the clock dividers in response to the frequency divide ratio code.

13. The bridge device of claim 1, wherein the frequency controller includes a clock divider for providing first intermediate clock signals on first edges of the system clock and second intermediate clock signals on second edges of the system clock, each of the first intermediate clock signals and the second intermediate clock signals having a period set by a ratio selector signal corresponding to the one of at least two dynamically selectable clock divide ratios, and clock combining logic for logically combining selected first intermediate clock signals and selected second intermediate clock signals to provide the memory clock having a frequency corresponding to the system clock divided by the one of at least two dynamically selectable clock divide ratios.

14. The bridge device of claim 13, wherein each of the first intermediate clock signals is generated one cycle of the system clock after a previous first intermediate clock signal is generated, and each of the second intermediate clock signals is generated one cycle of the system clock after a previous first intermediate clock signal is generated.

15. The bridge device of claim 13, wherein the clock divider is configured to generate each of the first intermediate clock signals in response to an initial first intermediate clock signal, and to generate each of the second intermediate clock signals in response to an initial second intermediate clock signal.

16. The bridge device of claim 15, wherein the initial second intermediate clock signal is generated a predetermined number of cycles of the system clock corresponding to the one of at least two dynamically selectable clock divide ratios after the initial first intermediate clock signal is generated.

17. The bridge device of claim 13, wherein the frequency controller includes a frequency divide ratio decoder for generating ratio selector signals in response to a frequency divide ratio code representing the one of at least two dynamically selectable clock divide ratios.

18. The bridge device of claim 17, wherein the clock combining logic includes logic configuration circuitry for providing control signals in response to the ratio selector signals, and clock generation circuitry configurable by the control signals for enabling a predetermined combination of the selected first intermediate clock signals and the selected second intermediate clock signals to be used for generating the memory clock having a frequency corresponding to the system clock divided by the one of at least two dynamically selectable clock divide ratios.

19. The bridge device of claim 13, wherein the clock divider includes
- a first configurable logic loop circuit for generating the first intermediate clock signals at the first edges of the system clock, the first configurable logic loop circuit being initiated in response to a first set signal, and
- a second configurable logic loop circuit for generating the second intermediate clock signals at the second edges of the system clock, the second configurable logic loop circuit being initiated in response to a second set signal received after a number of cycles of the system clock predetermined by the one of at least two dynamically selectable clock divide ratios.

20. The bridge device of claim 19, wherein the first configurable logic loop circuit includes
- cascaded first edge triggered logic elements each having an output for providing one of the first intermediate clock signals and each having an input for latching a previous one of the first intermediate clock signals in response to the first edges of the system clock, the cascaded first edge triggered logic elements including a first initializing logic element configured to receive the first set signal,
- loop adjustment circuits for changing a size of the first configurable logic loop circuit by selectively coupling only one of the first intermediate clock signals to the first initializing logic element in response to the ratio selector signals.

21. The bridge device of claim 20, wherein the second configurable logic loop circuit includes
- cascaded second edge triggered logic elements each having an output for providing one of the second intermediate clock signals and each having an input for latching a previous one of the second intermediate clock signals in response to the second edges of the system clock, the cascaded second edge triggered logic elements including a second initializing logic element configured to receive the second set signal,
- loop adjustment circuits for changing a size of the second configurable logic loop circuit by selectively coupling only one of the second intermediate clock signals to the second initializing logic element in response to the ratio selector signals.

22. The bridge device of claim 19, wherein the frequency controller includes a clock initialization circuit for providing the first set signal and the second set signal in response to a reset condition.

23. The bridge device of claim 22, wherein the clock initialization circuit includes
- at least one signal detector for providing at least one detection signal in response to a transition of at least one received signal,
- a reset circuit for resetting the first configurable logic loop circuit and the second configurable logic loop circuit in response to the at least one detection signal, and
- a startup synchronizer for providing the first set signal and the second set signal in response to the at least one detection signal, the second set signal being provided after a number of cycles of the system clock predetermined by the one of at least two dynamically selectable clock divide ratios.

24. The bridge device of claim 23, wherein the at least one signal detector includes
- a chip enable signal detector for providing a first detection signal when a transition of a chip enable signal is detected, and
- a divide ratio detector for providing a second detection signal when a change in a frequency divide ratio code corresponding to the one of at least two dynamically selectable clock divide ratios is detected, the at least one detection signal including the first detection signal and the second detection signal.

25. The bridge device of claim 24, wherein the reset circuit includes a power up reset circuit for providing a third detection signal when a power supply voltage reaches a predetermined threshold level.

26. The bridge device of claim 25, wherein the reset circuit generates a first reset signal for resetting the first configurable logic loop circuit and a second reset signal for resetting the first configurable logic loop circuit in response to at least one of the first detection signal, the second detection signal and the third detection signal.

27. The bridge device of claim 26, wherein the reset circuit generates the first reset signal at one of the first edges of the system clock after receiving at least one of the first detection signal, the second detection signal and the third detection signal, and generates the second reset signal at one of the second edges of the system clock immediately following the one of the first edges.

28. The bridge device of claim 23, wherein the startup synchronizer includes
- an initializing logic element for generating the first set signal in response to the at least one detection signal at one of the second edges of the system clock,
- cascaded logic elements for generating set configuration signals in response to the first set signal at subsequent second edges of the system clock following the one of the second edges,
- a phase adjustment circuit for generating the second set signal in response to a ratio selector signal at one of the first edges of the system clock.

* * * * *